(12) United States Patent
Yonemura et al.

(10) Patent No.: US 8,373,780 B2
(45) Date of Patent: Feb. 12, 2013

(54) SOLID-STATE IMAGE SENSOR AND CAMERA

(75) Inventors: Koichi Yonemura, Kyoto (JP); Sei Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 28 days.

(21) Appl. No.: 13/209,086

(22) Filed: Aug. 12, 2011

(65) Prior Publication Data

US 2011/0292267 A1 Dec. 1, 2011

Related U.S. Application Data

(63) Continuation of application No. PCT/JP2009/005879, filed on Nov. 5, 2009.

(30) Foreign Application Priority Data

Feb. 13, 2009 (JP) .................................. 2009-030973

(51) Int. Cl.
*H04N 9/083* (2006.01)
*H04N 3/14* (2006.01)

(52) U.S. Cl. ........ 348/293; 348/311; 348/303; 257/217; 257/223

(58) Field of Classification Search .................. 348/293, 348/294, 303, 311, 316, E05.091
See application file for complete search history.

(56) References Cited

U.S. PATENT DOCUMENTS

| | | | | |
|---|---|---|---|---|
| 4,280,141 A | * | 7/1981 | McCann et al. | ............. 348/295 |
| 6,185,270 B1 | | 2/2001 | Kawamura | |
| 7,038,723 B1 | * | 5/2006 | Kuroda et al. | ............... 348/312 |
| 7,619,196 B2 | * | 11/2009 | Oda | .......................... 250/208.1 |
| 2002/0039144 A1 | | 4/2002 | Yamada | |
| 2006/0274178 A1 | | 12/2006 | Inoue et al. | |
| 2008/0048212 A1 | * | 2/2008 | Nakashima et al. | .......... 257/222 |
| 2009/0147121 A1 | | 6/2009 | Inoue et al. | |
| 2009/0152605 A1 | * | 6/2009 | Ohno et al. | .................... 257/294 |

FOREIGN PATENT DOCUMENTS

| | | |
|---|---|---|
| JP | 07-335854 | 12/1995 |
| JP | 08-130684 | 5/1996 |
| JP | 11-54741 | 2/1999 |
| JP | 2002-077931 | 3/2002 |
| JP | 2002-112122 | 4/2002 |
| JP | 2006-310655 | 11/2006 |

\* cited by examiner

*Primary Examiner* — Hung Lam
(74) *Attorney, Agent, or Firm* — McDermott Will & Emery LLP

(57) ABSTRACT

A solid-state image sensor includes: a transfer control section configured to control charge transfer from the vertical transfer section to the horizontal transfer section. The transfer control section has a plurality of unit control sections corresponding to the transfer packets. The unit control section has a vertical transfer channel and a plurality of control section electrodes formed over the vertical transfer channel. The control section electrodes include a signal charge accumulating electrode and a transfer inhibiting electrode, which are sequentially formed from a side of the vertical transfer section. The vertical transfer channels are independently connected to a horizontal transfer channel. When stopping the charge transfer from the vertical transfer section to the horizontal transfer section, a high-level voltage is applied to the signal charge accumulating electrode, and a low-level voltage is applied to the transfer inhibiting electrode.

20 Claims, 25 Drawing Sheets

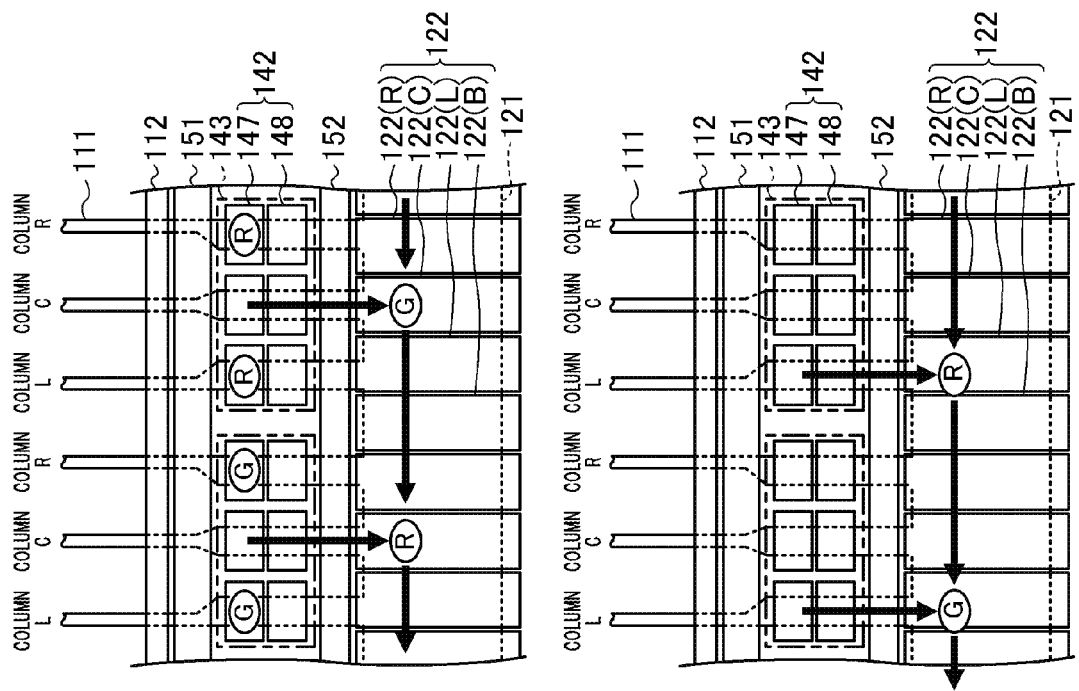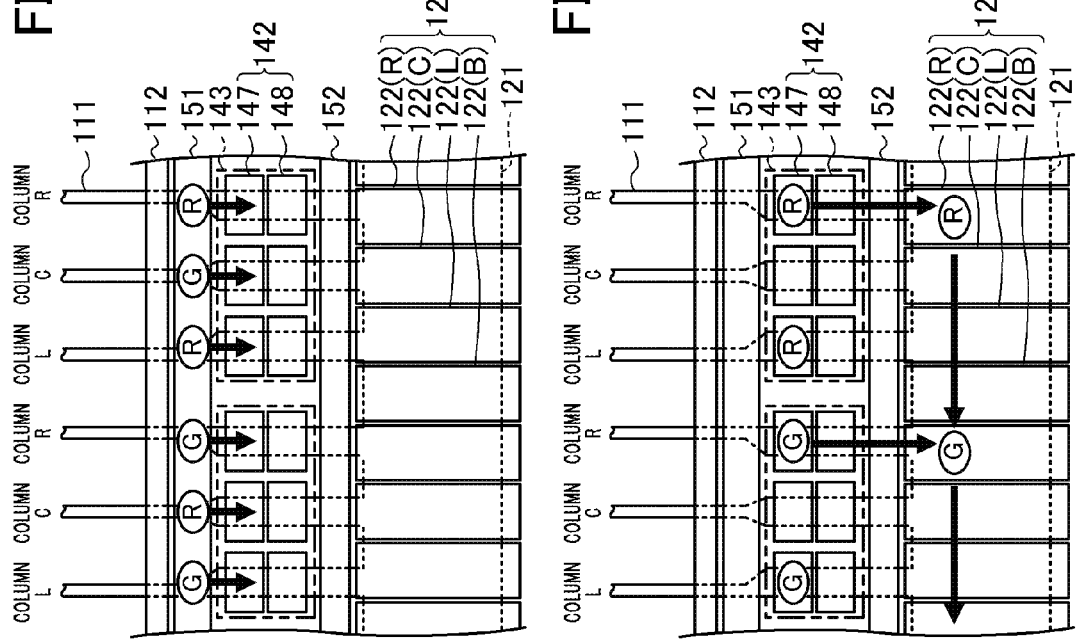

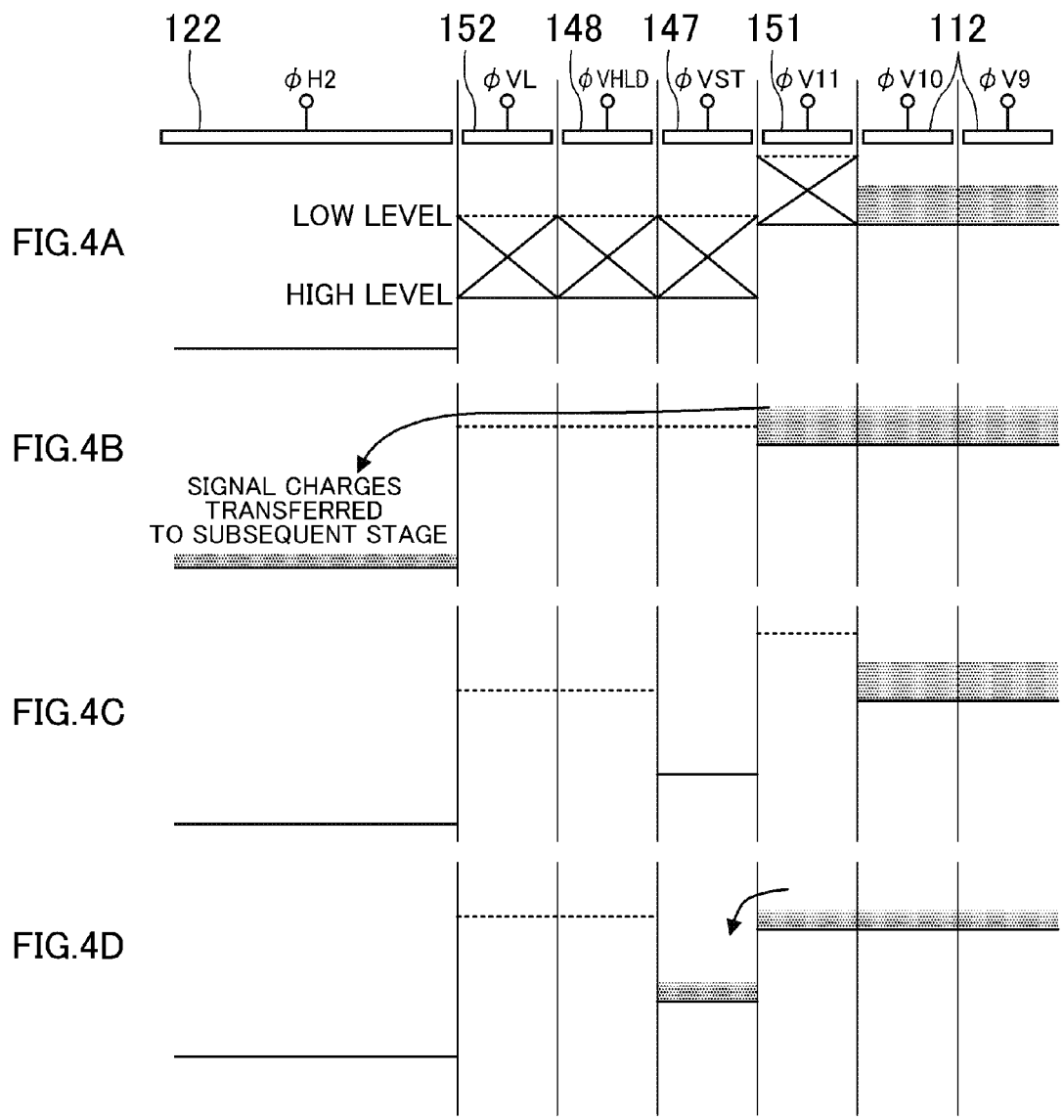

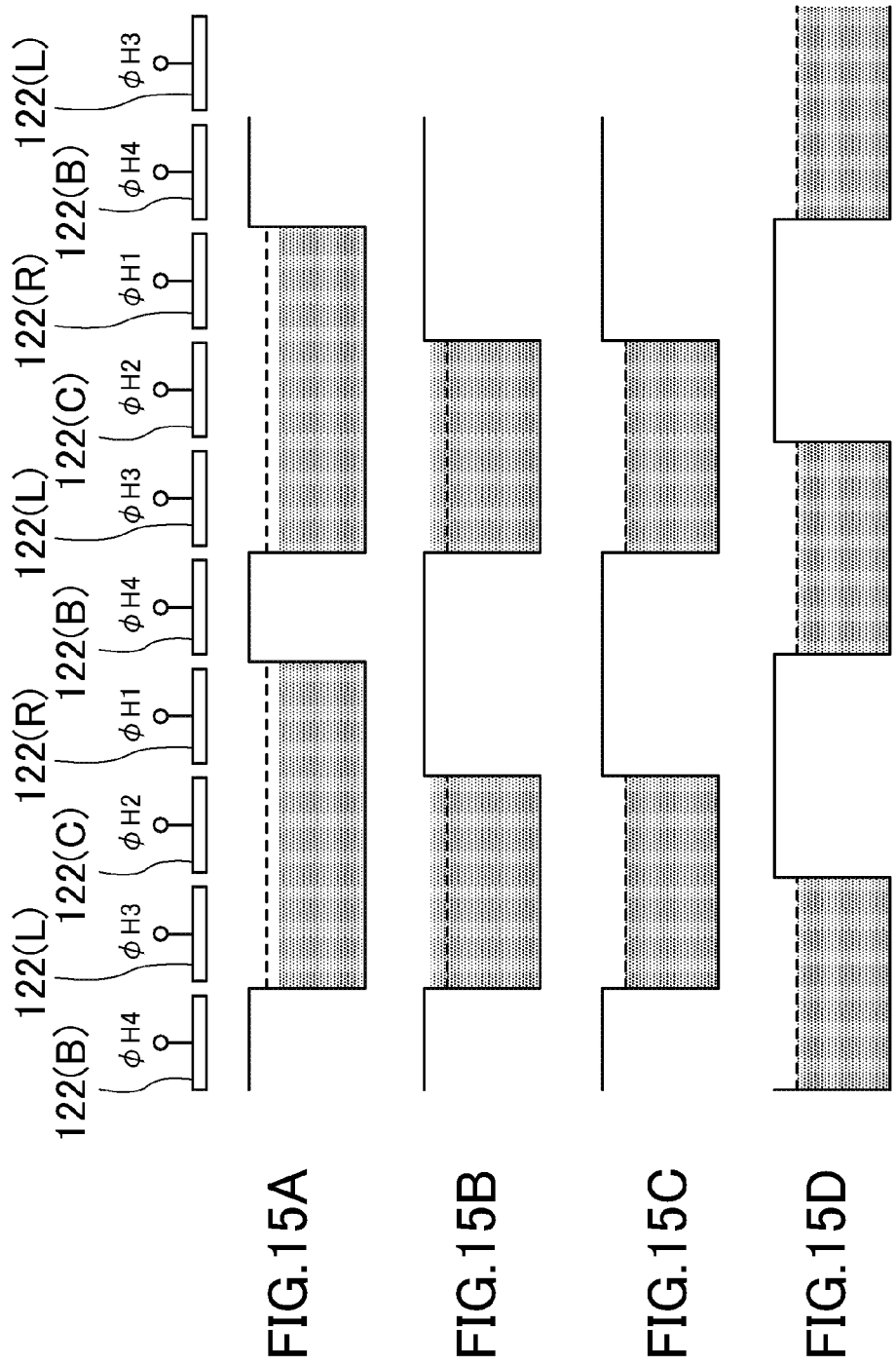

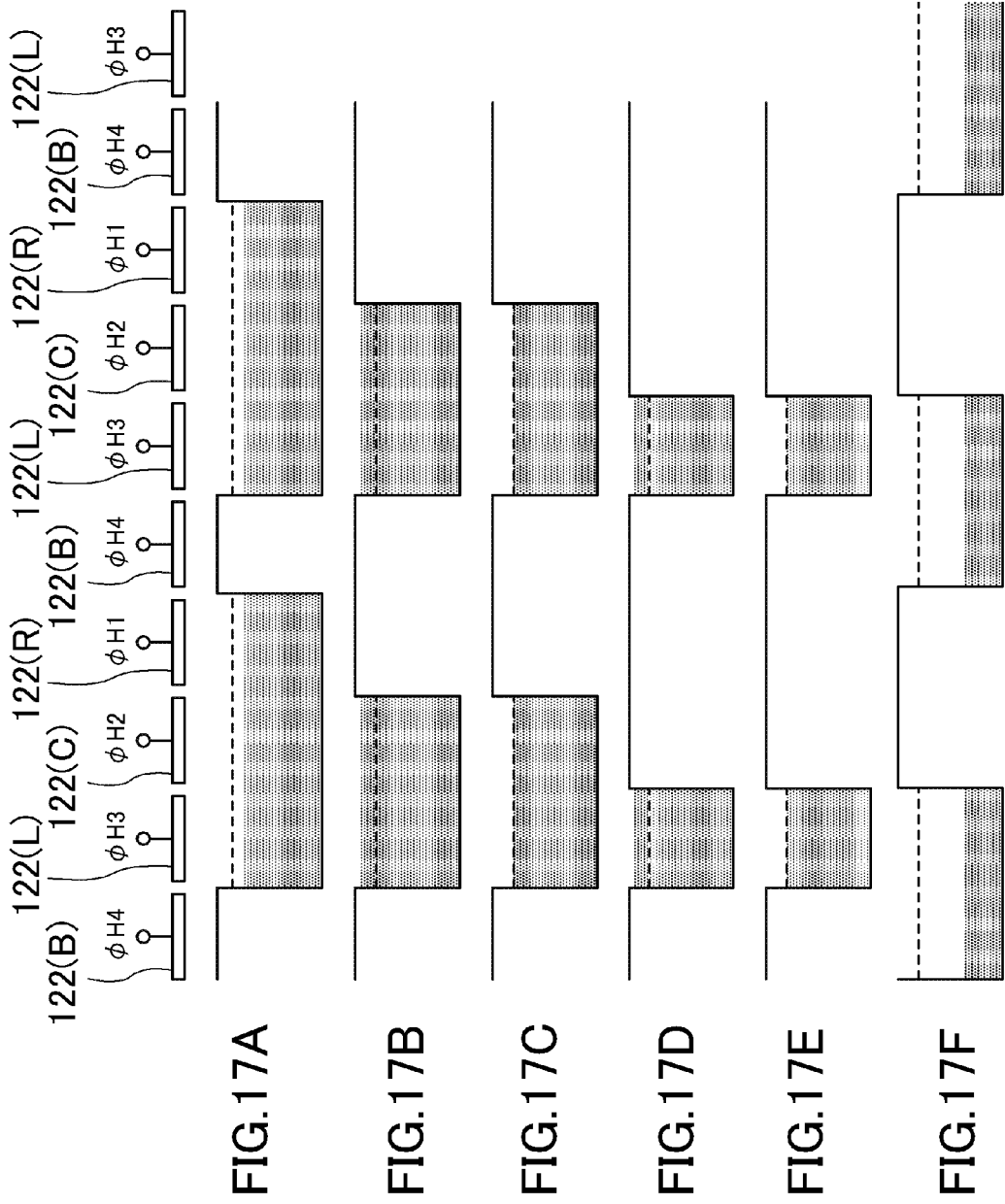

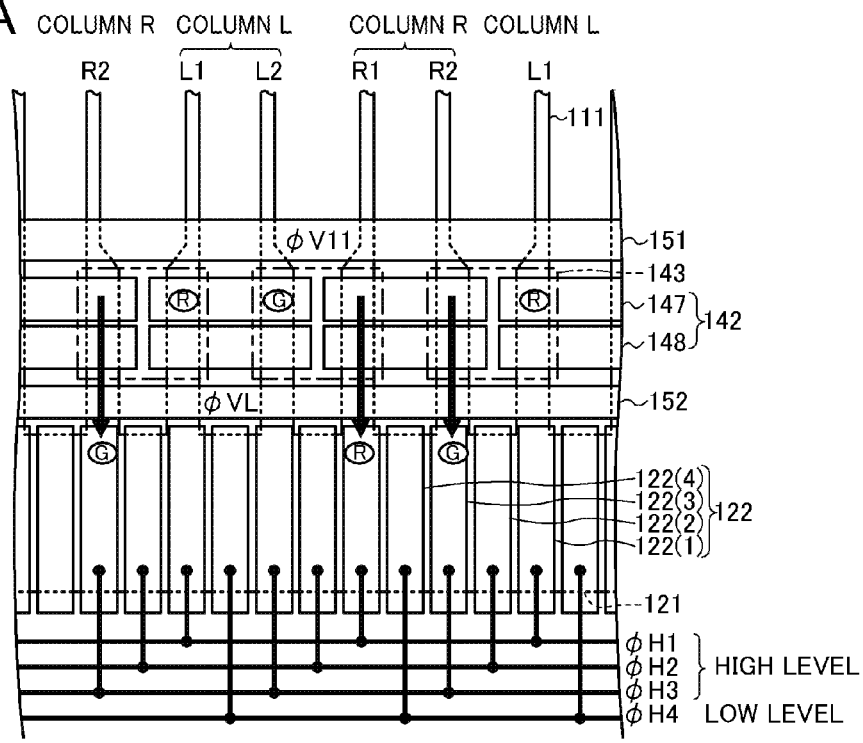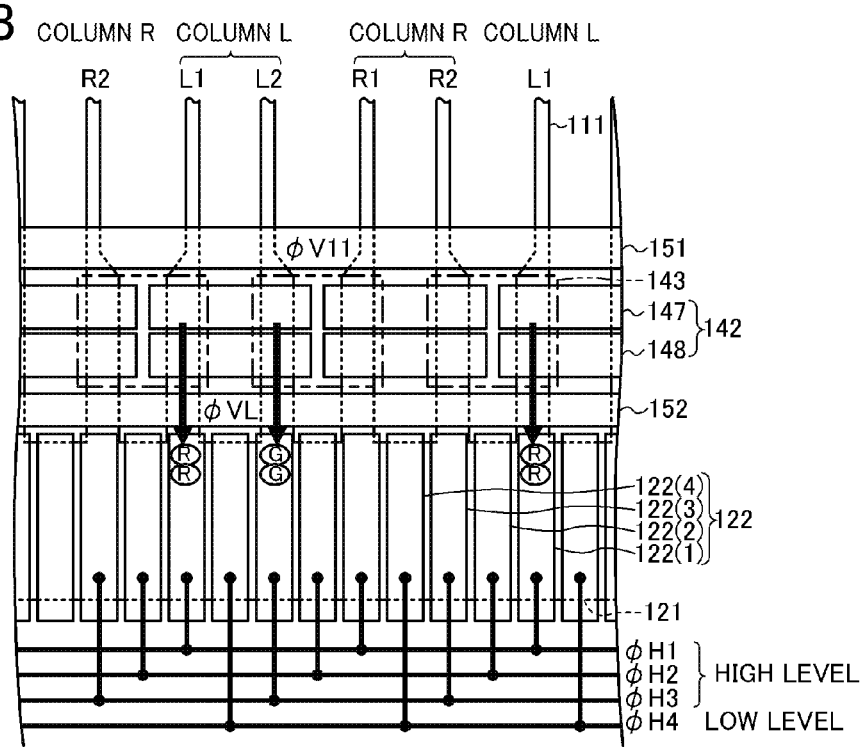

SOLID-STATE IMAGE SENSOR AND CAMERA

CROSS-REFERENCE TO RELATED APPLICATION

This is a continuation of PCT International Application PCT/JP2009/005879 filed on Nov. 5, 2009, which claims priority to Japanese Patent Application No. 2009-030973 filed on Feb. 13, 2009. The disclosures of these applications including the specifications, the drawings, and the claims are hereby incorporated by reference in their entirety.

BACKGROUND

The present disclosure relates to solid-state image sensors and cameras, and more particularly to solid-state image sensors having a pixel addition function, and cameras.

Charge coupled devices (CCDs) for digital still cameras typically have ten millions or more of pixels. The number of pixels in the horizontal direction has reached about 4,000, and horizontal transfer electrodes forming a horizontal transfer section have been reduced in size. Thus, in conventional two-phase drive in which one transfer packet of the horizontal transfer section corresponds to one column in a vertical transfer section, capacitance between electrodes is significantly increased, resulting in high power consumption.

In order to solve this problem, a method has been proposed in which signal charges of one line are divided for interlace output. For example, the number of transfer packets in the horizontal transfer section is one third of the number of columns in the vertical transfer section, and an operation of transferring signal charges from the vertical transfer section to the horizontal transfer section and transferring the signal charges from the horizontal transfer section to an output section is divided into three operations. This can reduce the number of electrodes that form the horizontal transfer section, thereby reducing the capacitance between the electrodes. Thus, power consumption can be reduced. In the solid-state image sensors having such a structure, the number of transfer packets in the horizontal transfer section is less than the number of columns in the vertical transfer section. Thus, a transfer control section is required which selectively controls signal charge transfer from the vertical transfer section to the horizontal transfer section. The transfer control section needs to have a function to hold the signal charges during the first transfer operation.

The CCDs have been required to have not only an imaging mode (hereinafter referred to as the normal mode) in which signals of light-receiving elements are read from all the pixels and used as a still picture, but also a movie mode in which a moving picture is displayed on a liquid crystal monitor or is recorded. Although the frame rate can be 2-3 frames per second in the normal mode, the frame rate needs to be 30 frames per second in the movie mode. Thus, in the movie mode, the signal charges that are obtained from a plurality of pixels are added together within the image sensor, or the signal charges that are read from the pixels are selectively skipped, thereby reducing the number of output signals, and implementing a high frame-rate moving picture. In the case where the number of pixels in the normal mode is ten millions, an image needs to be compressed to about 1/10 of a still image even in a high-resolution 720-p output (1,280 by 720 pixels), whereby the number of signal charges to be added together is increased.

Solid-state image sensors for digital still cameras typically use a Bayer pattern, and add signal charges of adjoining pixels of the same color together. Such addition of signal charges in the solid-state image sensors requires addition in the vertical direction and addition in the horizontal direction. The addition of signal charges in the vertical direction can be performed within the vertical transfer section by providing a plurality of vertical transfer electrodes configured to perform a read operation from photoelectric conversion elements to the vertical transfer section, and driving the vertical transfer electrodes at appropriate timings. However, in order to perform the addition of signal charges in the horizontal direction, a transfer control section that selectively controls signal charge transfer needs to be provided between the vertical transfer section and the horizontal transfer section.

The following example is known as a solid-state image sensor provided with such a transfer control section (see, e.g., Japanese Patent Publication No. 2006-310655). As shown in FIG. 25, charge transfer sections (vertical output gate (VOG) sections) 504 are provided between vertical transfer sections 501 and a horizontal transfer section 502. Every two or more adjoining ones of the vertical transfer sections 501 form a group, and each group corresponds to a unit transfer bit of the horizontal transfer section 502. The VOG section 504 is provided for each group, and transfers signal charges from the vertical transfer sections 501 in the group to a corresponding one of the unit transfer bits of the horizontal transfer section 502. Charge holding sections 507 each having a storage section 505 and a holding section 506 are respectively formed between columns "a" and "b" of the vertical transfer sections 501 in the same group and a corresponding one of the VOG sections 504.

Operation of the solid-state image sensor configured as described above will be described below. In this example, the transfer control section described above is a region including the charge holding sections 507 and the VOG sections 504. The horizontal transfer section 502 is described below as three-phase drive. In the normal mode, signal charges of column "c" are transferred to H1 of the horizontal transfer section 502 via the VOG section 504, and are then horizontally transferred to an output section. At this time, signal charges of columns "a" and "b" are held in the charge holding sections 507. After the signal charges of column "c" are transferred, the signal charges of column "a" are transferred to H1 of the horizontal transfer section 502, and are then horizontally transferred to the output section. Thereafter, the signal charges of column "b" are transferred to H1 of the horizontal transfer section 502, and are then horizontally transferred to the output section. Thus, in the normal mode, signal charges of one horizontal line are divided into three parts for output.

On the other hand, in a horizontal three-pixel addition mode, the signal charges of column "a" and the signal charges of column "c" are transferred to H1 of the horizontal transfer section 502 via the VOG section 504. Then, the signal charges are transferred leftward by one unit transfer bit. Thereafter, the signal charges of column "b" are transferred to H1 of the horizontal transfer section 502 via the VOG section 504. The three-pixel addition in the horizontal direction can be performed in this manner. In this operation mode, since the number of signal charges after the addition matches the number of transfer packets in the horizontal transfer section, signal charges of one line need not be divided into three parts for transfer as in the normal mode. In either case, the signal charges are transferred from the vertical transfer sections 501 to the horizontal transfer section 502 via the VOG section 504, and the horizontal transfer sections 501 are coupled to the VOG section 504.

SUMMARY

However, transfer degradation tends to occur in the conventional configuration. In the conventional configuration, vertical transfer channels of the vertical transfer sections are bundled in the VOG sections that are placed before the horizontal transfer section. Thus, the vertical transfer channels need to be narrowed down toward horizontal transfer electrodes that receive the signal charges when transferring the signal charges from the VOG sections to the horizontal transfer section. Sharply narrowing down the vertical transfer channels reduces the potential depth on the side of the horizontal transfer section, whereby transfer degradation tends to occur. On the other hand, gradually narrowing down the vertical transfer channels increases the transfer length, whereby transfer degradation tends to occur.

Moreover, since the CCDs have been reduced in size in recent years, the width of the vertical transfer channels in a pixel repetition region has been reduced. Thus, the impurity concentration of the vertical transfer channels needs to be increased in order to suppress reduction in transfer efficiency resulting from a reduced number of charges to be handled and a reduced degree of modulation due to a narrow channel effect. However, bundling the vertical transfer channels having a high impurity concentration in the VOG sections reduces the narrow channel effect in the VOG sections. In the case where the vertical transfer channels have a high impurity concentration, the potential depth of the VOG sections is extremely increased, and the potential difference between the vertical last electrode and the horizontal transfer section is reduced, making it difficult to transfer signal charges from the vertical last electrode to the horizontal transfer section. It is possible to reduce the potential depth by changing the amount of impurity implantation in the VOG sections. However, this increases the cost due to an increased number of steps, and tends to cause transfer degradation due to misalignment.

It is an object of the present disclosure to implement a solid-state image sensor which is less likely to cause transfer degradation in a transfer control section, and which reduces power consumption and performs an efficient addition operation.

An example solid-state image sensor includes: a plurality of photoelectric conversion elements arranged in a matrix pattern in a pixel repetition region; a vertical transfer section configured to read charges from the photoelectric conversion elements to transfer the read charges in a column direction; a horizontal transfer section configured to receive the charges from the vertical transfer section to transfer the received charges in a row direction; and a transfer control section configured to control the charge transfer from the vertical transfer section to the horizontal transfer section. The vertical transfer section has a plurality of vertical transfer channels extending in the column direction, and a plurality of vertical transfer electrodes formed over the vertical transfer channels. The horizontal transfer section has a horizontal transfer channel extending in the row direction, and a plurality of horizontal transfer electrodes formed over the horizontal transfer channel, and is formed by a plurality of transfer packets. The transfer packet includes adjoining two or more of the plurality of horizontal transfer electrodes, and correspond to adjoining two or more of the plurality of vertical transfer channels. The transfer control section has a plurality of unit control sections corresponding to the transfer packets. The unit control section has the vertical transfer channel and a plurality of control section electrodes formed over the vertical transfer channel. The control section electrodes include a signal charge accumulating electrode and a transfer inhibiting electrode, which are sequentially formed from a side of the vertical transfer section. The vertical transfer channels are independently connected to the horizontal transfer channel. When stopping the charge transfer from the vertical transfer section to the horizontal transfer section, a high-level voltage is applied to the signal charge accumulating electrode, and a low-level voltage is applied to the transfer inhibiting electrode.

In the example solid-state image sensor, the vertical transfer channels are independently connected to the horizontal transfer channel. Thus, a potential depth of the vertical transfer channels is less likely to be reduced on the side of the horizontal transfer section, whereby transfer degradation is less likely to occur. Moreover, the narrow channel effect is less likely to be reduced, thereby facilitating the signal charge transfer from the last electrode to the horizontal transfer section.

In the example solid-stage image sensor, the signal charge accumulating electrode and the transfer inhibiting electrode may be independently formed in each of the unit control sections.

In the example solid-stage image sensor, the signal charge accumulating electrode and the transfer inhibiting electrode, which are included in different adjoining ones of the unit control sections, may be formed as an integral signal charge accumulating electrode and an integral transfer inhibiting electrode, respectively.

In the example solid-state image sensor, the control section electrodes may include a control section transfer electrode, the control section transfer electrode may be formed over the vertical transfer channel that is different from the vertical transfer channel over which the signal charge accumulating electrode and the transfer inhibiting electrode are formed, and the control section transfer electrode may be driven by a same transfer pulse as that of the vertical transfer electrode provided in the pixel repetition region. In this case, the vertical transfer channel located below the control section transfer electrode may be wider on a side of the horizontal transfer section than on a side of the vertical transfer section.

The example solid-state image sensor may further include an intermediate electrode formed over the vertical transfer channels between the transfer control section and the vertical transfer section, wherein a potential at a position corresponding to the intermediate electrode in the vertical transfer channel when a low-level voltage is applied to the intermediate electrode may be equal to a potential at a position corresponding to the vertical transfer electrode in the vertical transfer channel when the low-level voltage is applied to the vertical transfer electrode.

The example solid-state image sensor may further include an intermediate electrode formed over the vertical transfer channels between the transfer control section and the vertical transfer section, wherein when the signal charges accumulated below the vertical transfer electrode adjoining the intermediate electrode are transferred to the transfer control section, the control section electrode adjoining the intermediate electrode may rise to high level simultaneously with or earlier than the intermediate electrode.

In the example solid-state image sensor, the vertical transfer channels may be wider in the transfer control section than in the pixel repetition region, and an interval between centers of adjoining ones of the vertical transfer channels included in one of the unit control sections may be shorter in the transfer control section than in the pixel repetition region.

In the example solid-state image sensor, the transfer packet may include four of the horizontal transfer electrodes, and may correspond to three of the vertical transfer channels, and the three vertical transfer channels may be connected to the horizontal transfer channel at a position where adjoining three of the horizontal transfer electrodes are placed.

In the example solid-state image sensor, the transfer packet may include four of the horizontal transfer electrodes, and may correspond to three of the vertical transfer channels, and the three vertical transfer channels may be connected to the horizontal transfer channel at a position where adjoining three of the horizontal transfer electrodes are placed.

In the example solid-state image sensor, the transfer packet may include four of the horizontal transfer electrodes, and may correspond to three of the vertical transfer channels, and in a horizontal blanking period, a high-level voltage may be applied to two or more of the four horizontal transfer electrodes, and the horizontal transfer section may receive the signal charges from the three vertical transfer channels via the transfer control section.

In the example solid-state image sensor, the high-level voltage may be applied to three of the four horizontal transfer electrodes.

In the example solid-state image sensor, the transfer packet may include at least one of the horizontal transfer electrodes that is wider on a side of the transfer control section than on a side opposite from the transfer control section, and at least one of the horizontal transfer electrodes that is narrower on the side of the transfer control section than on the side opposite from the transfer control section.

The example solid-stage image sensor may further include a horizontal drain region extending in the row direction and adjoining the horizontal transfer channels with a barrier region interposed between the horizontal drain region itself and the horizontal transfer channels.

In the example solid-state image sensor, of the plurality of horizontal transfer electrodes, the number of horizontal transfer electrodes to which a high-level voltage is applied when the signal charges are transferred from the vertical transfer section may be different from the number of horizontal transfer electrodes to which the high-level voltage is applied after the transfer of the signal charges is completed.

In the example solid-state image sensor, the transfer packet may include four of the horizontal transfer electrodes, and may correspond to three of the vertical transfer channels, and the example solid-state image sensor may perform an operation of applying the high-level voltage to three of the four horizontal transfer electrodes to transfer the signal charges from the three vertical transfer channels to the horizontal transfer section, an operation of applying a low-level voltage to one or two of the four horizontal transfer electrodes to accumulate the transferred signal charges below two or one of the four horizontal transfer electrodes, and an operation of applying the high-level voltage to two of the four horizontal transfer electrodes to transfer the accumulated signal charges in a horizontal direction.

In the example solid-state image sensor, the unit control section may have three of the vertical transfer channels, and the example solid-stage image sensor may perform a first operation of transferring the signal charges from one of the three vertical transfer channels to a corresponding one of the transfer packets, a second operation of transferring in a horizontal direction the transferred signal charges to the transfer packet corresponding to an adjoining one of the unit control sections, and a third operation of transferring the signal charges from the other two of the three vertical transfer channels to the corresponding one of the transfer packets, thereby mixing the signal charges of the three vertical transfer channels in the horizontal transfer section.

In the example solid-state image sensor, in a mode in which the signal charges of one line are divided for output, the horizontal transfer electrode to which a high-level voltage is applied in a horizontal blanking period may be different in every division field.

In the example solid-state image sensor, the transfer packet may include four of the horizontal transfer electrodes and three of the vertical transfer channels, and in the mode in which the signal charges of one line are divided for output, the high-level voltage may be applied to three of the four horizontal transfer electrodes, and the horizontal transfer electrode that receives the signal charges from the three vertical transfer electrode may be different in every division field.

A camera of the present disclosure include the example solid-state image sensor.

According to the solid-state image sensor of the present disclosure, a solid-state image sensor can be implemented which is less likely to cause transfer degradation in a transfer control section, and which reduces power consumption and performs an efficient addition operation.

BRIEF DESCRIPTION OF THE DRAWINGS

FIGS. 2A-2D are diagrams showing charge transfer in a normal mode of the solid-state image sensor of the first embodiment.

FIGS. 4A-4D are diagrams showing the states of potentials of the solid-state image sensor of the first embodiment.

FIG. 14A shows an example in the case of the solid-state image sensor of the first embodiment, and FIGS. 14B-14C show an example in the case of the solid-state image sensor of the third embodiment.

FIGS. 15A-15D are diagrams showing the states where signal charges are accumulated in the horizontal transfer section.

FIGS. 17A-17F are diagrams showing the states where signal charges are accumulated in the horizontal transfer section.

FIGS. 24A-24B are diagrams showing charge transfer in a pixel addition mode of the solid-state image sensor of the seventh embodiment.

DETAILED DESCRIPTION

First Embodiment

Figure 1:
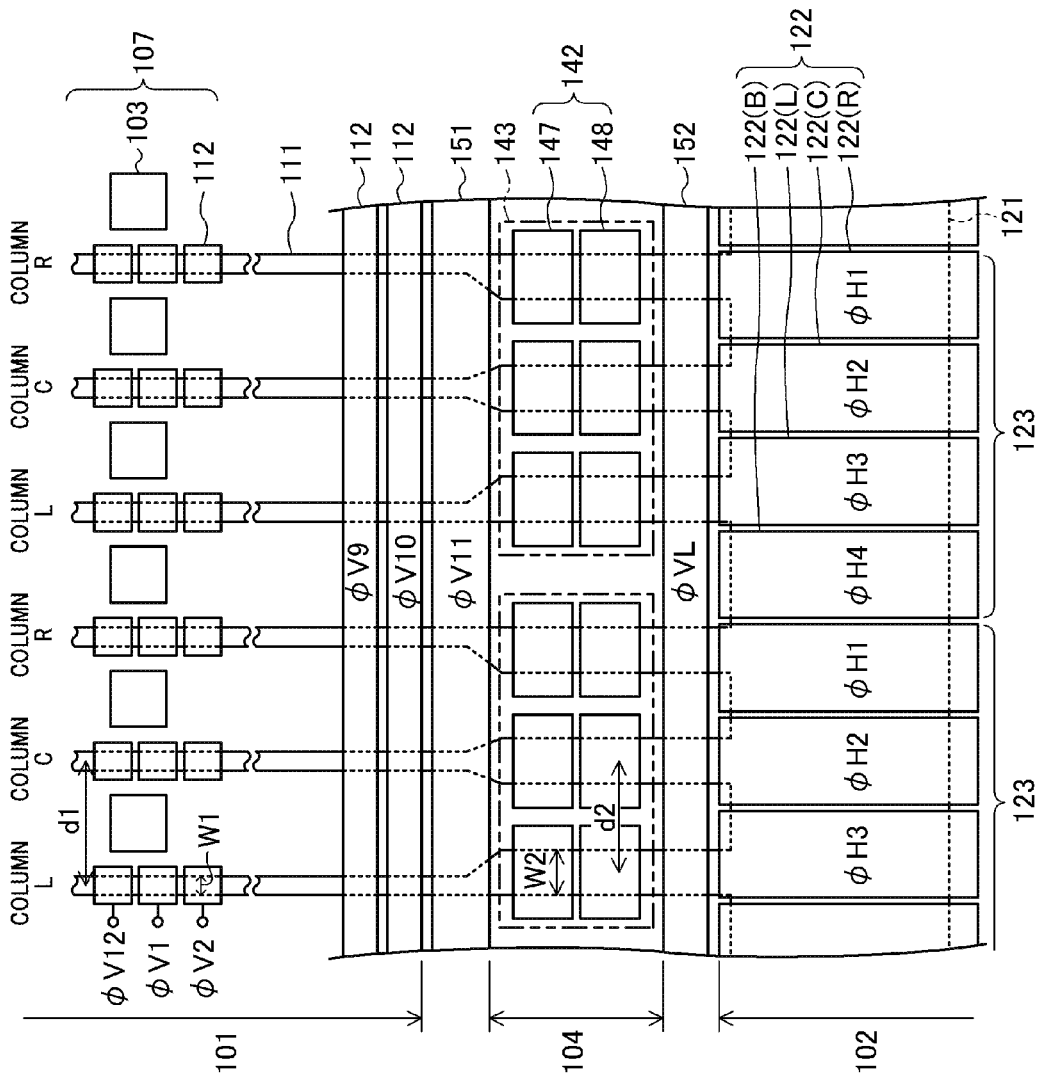
FIG. 1 is a plan view showing a configuration of a solid-state image sensor of a first embodiment.

FIG. 1 shows a configuration of a solid-state image sensor of a first embodiment of the present invention. As shown in FIG. 1, the solid-state image sensor of the present embodiment includes a plurality of photoelectric conversion elements 103, a vertical transfer section 101 configured to transfer charges read from the photoelectric conversion elements 103 in the column direction (the vertical direction), a horizontal transfer section 102 configured to receive the charges from the vertical transfer section 101 to transfer the received charges in the row direction (the horizontal direction), and a transfer control section 104 configured to control transfer of the charges from the vertical transfer section 101 to the horizontal transfer section 102.

The vertical transfer section 101 has vertical transfer channels 111 as an impurity diffusion layer extending in the column direction, and a plurality of vertical transfer electrodes 112 formed on the vertical transfer channels 111 with an insulating film (not shown) interposed therebetween. Although the photoelectric conversion elements 103 of only one row are shown in FIG. 1, the photoelectric conversion elements 103 are arranged in a matrix pattern to form a pixel repetition region 107.

The horizontal transfer section 102 has a horizontal transfer channel 121 extending in the row direction, and horizontal transfer electrodes 122 formed on the horizontal transfer channel 121 with an insulating film (not shown) interposed therebetween. The horizontal transfer section 102 is formed by a plurality of transfer packets 123. In FIG. 1, each transfer packet 123 includes four adjoining ones of the horizontal transfer electrodes 122, and each transfer packet 123 corresponds to three of the vertical transfer channels 111.

The transfer control section 104 includes a plurality of unit control sections 143 respectively corresponding to the transfer packets 123. Each unit control section 143 has the vertical transfer channels 111, and a plurality of control section electrodes 142 formed over the vertical transfer channels 111. Each control section electrode 142 includes a signal charge accumulating electrode 147 and a transfer inhibiting electrode 148 which are sequentially formed in this order from the side of the vertical transfer section 101.

An intermediate electrode 151 is provided between the vertical transfer section 101 and the transfer control section 104. A last electrode 152 is provided between the transfer control section 104 and the horizontal transfer section 102.

The solid-state image sensor of the present embodiment is four-phase driven as each transfer packet 123 is formed by four horizontal transfer electrodes 122. Each transfer packet 123 corresponds to three vertical transfer channels 111 of columns L, C, and R. Each unit control section 143 of the transfer control section 104 is formed so as to correspond to three vertical transfer channels 111 of columns L, C, and R corresponding to one transfer packet 123. Transfer pulses φVST-L and φVHLD-L are applied to the signal charge accumulating electrode 147 and the transfer inhibiting electrode 148 of column L. Transfer pulses φVST-C and φVHLD-C are applied to the signal charge accumulating electrode 147 and the transfer inhibiting electrode 148 of column C. Transfer pulses φVST-R and φVHLD-R are applied to the signal charge accumulating electrode 147 and the transfer inhibiting electrode 148 of column R.

Since the length of the horizontal transfer electrodes in the transfer direction can be reduced in the four-phase drive as compared to the three-phase drive, the four-phase drive is advantageous in that low-voltage drive can be implemented. For example, if the pixel size is about 1.5 μm, the solid-state image sensor can be driven at 1.8 V. The voltage of 1.8 V is a voltage that is also used in other semiconductor elements that are mounted on digital still cameras, etc., and therefore, cameras, etc. can be easily designed if they can be driven at 1.8 V. Note that in the following description, as an example, the low and high levels of pulses that are applied to each electrode of the horizontal transfer section are 0 V and 1.8 V, respectively, and the low and high levels of pulses that are applied to each electrode of the vertical transfer section and the transfer control section are −6 V and 0 V, respectively.

The solid-state image sensor of the present embodiment is configured so that columns L, C, and R of the vertical transfer channels 111 correspond to three of the four horizontal transfer electrodes 122 that form the transfer packet 123. In the four-phase drive, one of the four electrodes need only be used as a barrier. In the following description, the horizontal transfer electrode corresponding to column R is denoted by the horizontal transfer electrode 122(R), the horizontal transfer electrode corresponding to column C is denoted by the horizontal transfer electrode 122(C), the horizontal transfer electrode corresponding to column L is denoted by the horizontal transfer electrode 122(L), and the horizontal transfer electrode that is used as a barrier is denoted by the horizontal transfer electrode 122(B).

In a horizontal blanking period, the horizontal transfer electrodes 122(L), 122(C), and 122(R) are allowed to receive signal charges from the vertical transfer section 101 when set to high level.

Operation of the solid-state image sensor of the present embodiment will be described below. In the following description, the "normal mode" refers to a 3:1 interlace drive mode in which signal charges of one row are divided into three parts and horizontally transferred, and the "movie mode" refers to a drive mode in which signal charges of three pixels of the same color adjoining each other in the horizontal direction are added together.

Figure 3:
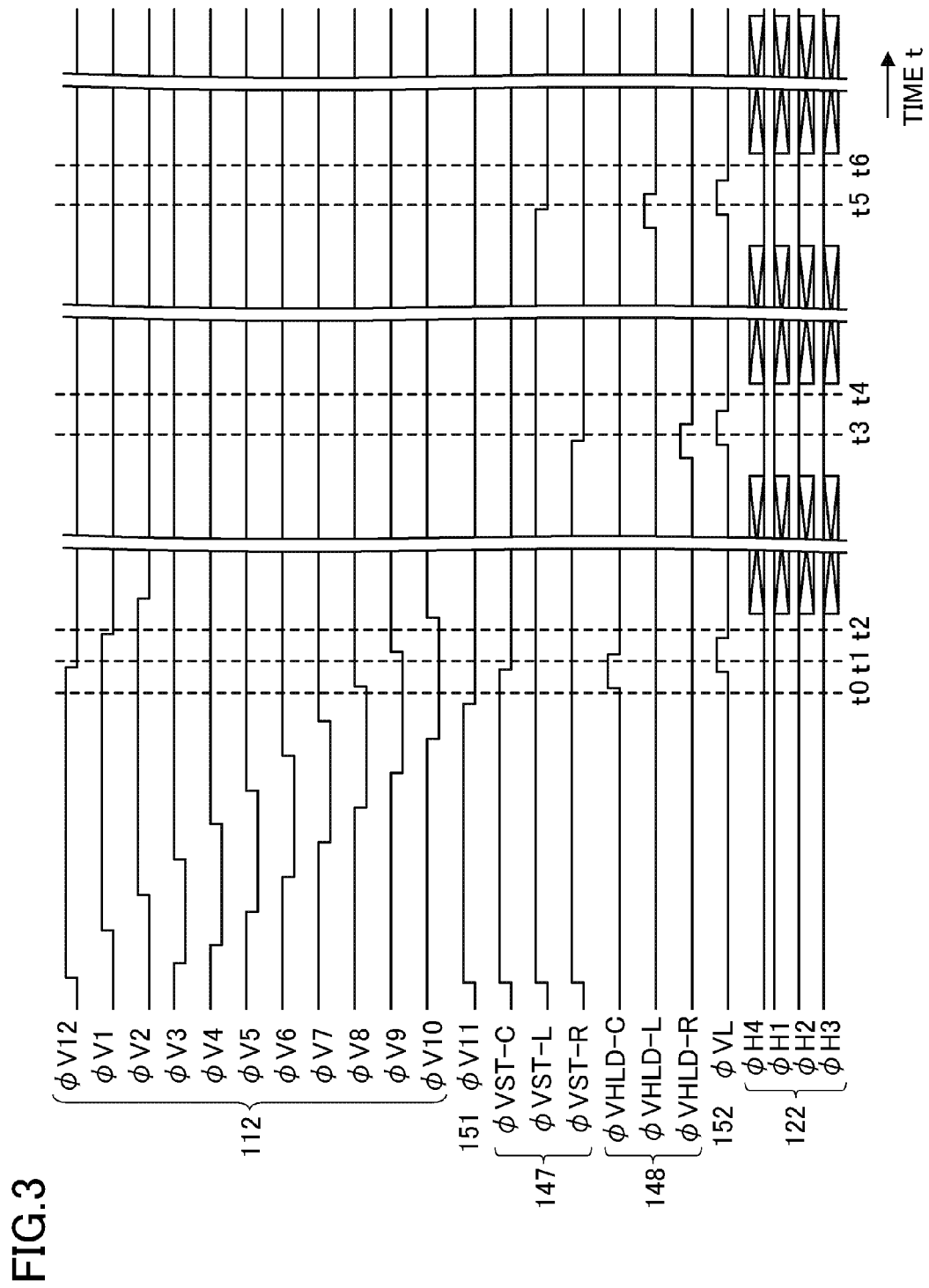
FIG. 3 is a timing chart showing drive timings in the normal mode of the solid-state image sensor of the first embodiment.

First, the normal mode will be described. FIGS. 2A-2D show the states of signal charge transfer in the normal mode, and FIG. 3 shows drive timings in the normal mode.

As shown in FIGS. 2A-2D, in the solid-state image sensor of the present embodiment, the number of transfer packets in the horizontal transfer section 102 is one third of the number of columns in the vertical transfer section 101. Thus, signal charges are transferred from the vertical transfer section 101 to the horizontal transfer section 102 via the transfer control section 104 sequentially at three times in the order of columns C, R, and L, and are transferred from the horizontal transfer section 102 to an output amplifier. Although the number of drive phases of the vertical transfer section 101 can be 6, 8, 12, etc., an example of 12-phase drive is shown in the present embodiment. Thus, signal charges are accumulated in eight vertical transfer electrodes 112 in a horizontal transfer period.

More specifically, as shown in FIG. 2A, signal charges accumulated in the vertical transfer electrodes 112 are first transferred to the signal charge accumulating electrode 147 of each column via the intermediate electrode 151. At time t0 in FIG. 3, a pulse φV11 that is applied to the intermediate electrode 151 is at low level (e.g., −6), and φVST-L that is applied to the signal charge accumulating electrode 147 of column L, φVST-C that is applied to the signal charge accumulating electrode 147 of column C, and φVST-R that is applied to the signal charge accumulating electrode 147 of column R are at high level (e.g., 0 V). Thus, signal charges accumulated in the intermediate electrode 151 of each column are transferred to the signal charge accumulating electrodes 147. Moreover, φVHLD-L that is applied to the transfer inhibiting electrode 148 of column L, φVHLD-C that is applied to the transfer inhibiting electrode 148 of column C, and φVHLD-R that is applied to the transfer inhibiting electrode 148 of column R are at low level, thereby forming a potential barrier and inhibiting transfer of the signal charges to the subsequent stage.

Then, as shown in FIG. 2B, the signal charges of column C are transferred to the horizontal transfer section 102 as a first division field. During a period of t1-t2 in FIG. 3, φVHLD-L that is applied to the transfer inhibiting electrode 148 of column L, and φVHLD-R that is applied to the transfer inhibiting electrode 148 of column R are kept at low level, and φVHLD-C that is applied to the transfer inhibiting electrode 148 of column C and φVL that is applied to the last electrode 152 are transitioned to low level. At this time, φH1 that is applied to the horizontal transfer electrode 122(R), φH2 that is applied to the horizontal transfer electrode 122(C), and φH3 that is applied to the horizontal transfer electrode 122(L) are at high level (e.g., 1.8 V). Then, the signal charges of the horizontal transfer section 102 are transferred to the output section, whereby the signal charges of columns C are output. Note that although the signal charge accumulating electrode 147 is set to low level in the horizontal transfer period in FIG. 3, the signal charge accumulating electrode 147 need not necessarily be at low level in this period.

Then, as shown in FIG. 2C, signal charges of column R are transferred to the horizontal transfer portion 102 as a second division field. In the period of t3-t4 in FIG. 3, φVHLD-L that is applied to the transfer inhibiting electrode 148 of column L are kept at low level, and φVHLD-R that is applied to the transfer inhibiting electrode 148 of column R and φVL that is applied to the last electrode 152 are transitioned to low level. At this time, φH1 that is applied to the horizontal transfer electrodes 122(R), φH2 that is applied to the horizontal transfer electrode 122(C), and φH3 that is applied to the horizontal transfer electrode 122(L) are at high level. Then, the signal charges of the horizontal transfer section 102 are transferred to the output section, whereby the signal charges of columns R are output.

Subsequently, as shown in FIG. 2D, signal charges of column L are transferred to the horizontal transfer portion 102 as a third division field. In the period of t5-t6 in FIG. 3, φVHLD-L that is applied to the transfer inhibiting electrode 148 of column L and φVL that is applied to the last electrode 152 are transitioned to low level. At this time, φH1 that is applied to the horizontal transfer electrode 122(R), φH2 that is applied to the horizontal transfer electrode 122(C), and φH3 that is applied to the horizontal transfer electrode 122(L) are at high level. Then, the signal charges of the horizontal transfer section 102 are transferred to the output section, whereby the signal charges of columns L are output. The signal charges of one line can be output by the above operation, and the remaining signal charges can be sequentially output by a similar operation.

As described above, the solid-state image sensor of the present embodiment operates to hold the signal charges during the horizontal transfer operation. In general, the signal charges are accumulated below four or more vertical transfer electrodes 112 in the pixel repetition region 107. Thus, the signal charge accumulating electrodes 147 need to accumulate all the signal charges accumulated in the plurality of vertical transfer electrodes 112. Accordingly, the saturation charge amount in the signal charge accumulating electrodes 147 needs to be made larger than that in the vertical transfer electrodes 112 in the pixel repetition region 107. The saturation charge amount can be increased by making the signal charge accumulating electrodes 147 longer than the vertical transfer electrodes 112, and also by making a width W2 of the vertical transfer channels 111 in the transfer control section 104 greater than a width W1 of the vertical transfer channels 111 in the pixel repetition region 107. Increasing only the length of the signal charge accumulating electrodes 148 reduces the transfer electric field, and thus reduces transfer efficiency. Thus, it is preferable to increase both the length of the signal charge accumulating electrodes 147 and the width of the vertical transfer channels 111.

With reduction in pixel size, the width of the vertical transfer channels 111 in the pixel repetition region 107 tends to be reduced. Thus, the vertical transfer channels 111 tend to be designed to have a high impurity concentration so that the potential depth of the vertical transfer channels 111 in the pixel repetition region 107 is not reduced due to the narrow channel effect. On the other hand, if the vertical transfer channels 111 is designed to have a high impurity concentration, and the width of the vertical transfer channels 111 is increased in the transfer control section 104, the potential depth of the vertical transfer channels is extremely increased in the signal charge accumulating electrodes 147 and the transfer inhibiting electrodes 148 as the transfer control section 104, as shown in FIG. 4A. Thus, as shown in FIG. 3, when transferring the signal charges to the transfer control section 104, it is preferable to set both the intermediate electrode 151 and the signal charge accumulating electrodes 147 to high level at the same timing, or to set the signal charge accumulating electrodes 147 to high level earlier than the intermediate electrode 151. For example, as shown in FIG. 4B, in the case where the intermediate electrode 151 is set to high level, and the signal charge accumulating electrodes 147, the transfer inhibiting electrodes 148, and the last electrode 152, which adjoin the intermediate electrode 151, are set to low level, the low-level potentials of these electrodes are close to the high-level potential of the intermediate electrode 151. Thus, even setting the signal charge accumulating electrodes 147 to the low level does not provide a barrier against the signal charges, and the signal charges may be transferred to the horizontal transfer section 102. In this case, these signal charges are mixed with, e.g., the signal charges of the column that have already been transferred. In order to reduce such a problem, as shown in FIG. 4C, the signal charge accumulating electrodes 147 are set to high level, and the intermediate electrode 151 is set to low level. Then, as shown in FIG. 4D, the intermediate electrode 151 is transitioned to high level so that the signal charges below the intermediate electrode 151 are transferred. By thus setting the signal charge accumulating electrodes 147 to high level earlier than the intermediate electrode 151, the transfer inhibiting electrodes 148 serve as a barrier, so that the signal charges are not allowed to be transferred to the horizontal transfer section 102.

Figure 5A:
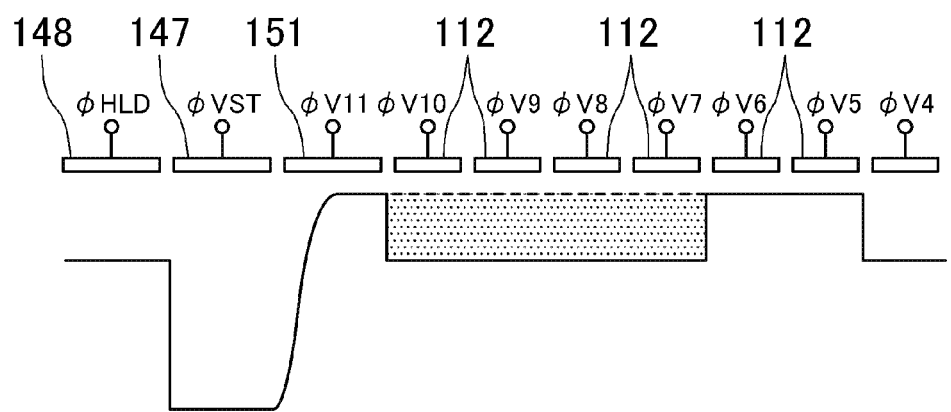
FIGS. 5A-5B are diagrams showing the states of potentials near a transfer control section of the solid-state image sensor of the first embodiment.
Figure 5B:
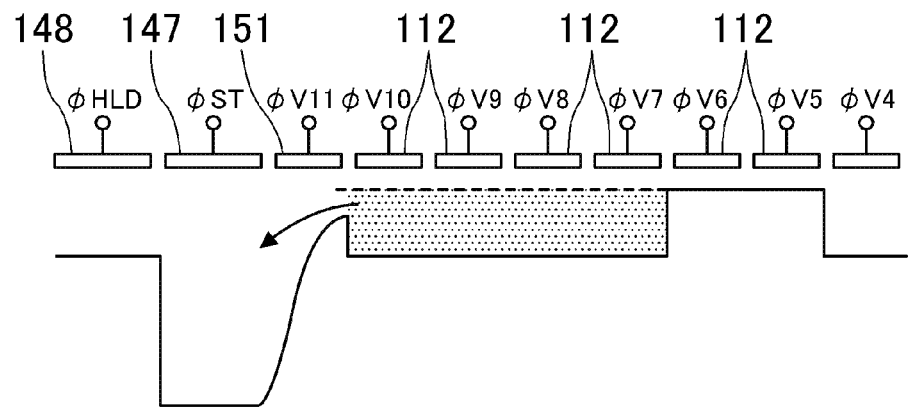

The configuration of the intermediate electrode 151 will be described below with reference to FIGS. 5A-5B. FIG. 5A shows a potential when the transfer pulse φV11 that is applied to the intermediate electrode 151 is set to low level, transfer pulses φV7-φV10 that are respectively applied to the four vertical transfer electrodes 112 from the side of the intermediate electrode 151 are set to high level, and transfer pulses φV5 and φV6 that are respectively applied to the subsequent two vertical transfer electrodes 112 are set to low level. Such four-electrode accumulation as shown in this example is a voltage applied state that is commonly used in six-phase drive. Each signal charge accumulating electrode 147 needs to accumulate signal charges accumulated in the plurality of vertical transfer electrodes 112. Thus, the signal charge accumulating electrodes 147 are made longer than the vertical transfer electrodes 112. The width of the vertical transfer channels 111 is greater in the transfer control section 104 than in the pixel repetition region 107. The potential depth below the signal charge accumulating electrodes 147 is greater than that below the vertical transfer electrodes 112. On the other hand, the intermediate electrode 151 reduces the possibility of mixing of the signal charges between different lines, and functions as a potential barrier against the signal charges accumulated in the four electrodes. Thus, as shown in FIG. 5A, the low-level potential of the intermediate electrode 151 is preferably the same as that of the vertical transfer electrodes 112. For example, as shown in FIG. 5B, in the case where the potential depth of the intermediate electrode 151 is greater than that of the vertical transfer electrodes 112, the saturation charge amount is reduced in the portion where the signal charges are accumulated in the four electrodes, and the signal charges are transferred toward the signal charge accumulating electrode 147, thereby causing mixture of the signal charges.

In the case where the intermediate electrode 151 is used as a potential barrier, as shown in FIG. 1, it is preferable to make the intermediate electrode 151 longer than the vertical transfer electrodes 112, and to increase the width of the vertical transfer channels 111 at a position on the side of the horizontal transfer portion 102 in the intermediate electrode 151. Increasing the width of the vertical transfer channels 111 can increase the potential depth on the side of the horizontal transfer portion 102 by using the narrow channel effect. Thus, reduction in the transfer electric field can be suppressed even if the length of the intermediate electrode 151 is increased. Thus, both reduction in the saturation charge amount and transfer degradation can be suppressed.

The movie mode will be described below. An example of adding signal charges of three pixels of the same color adjoining in the horizontal direction will be described in the present embodiment. FIGS. 6A-6D show the states of signal charge transfer in the movie mode, and FIG. 7 shows drive timings in the movie mode.

Figure 6A:
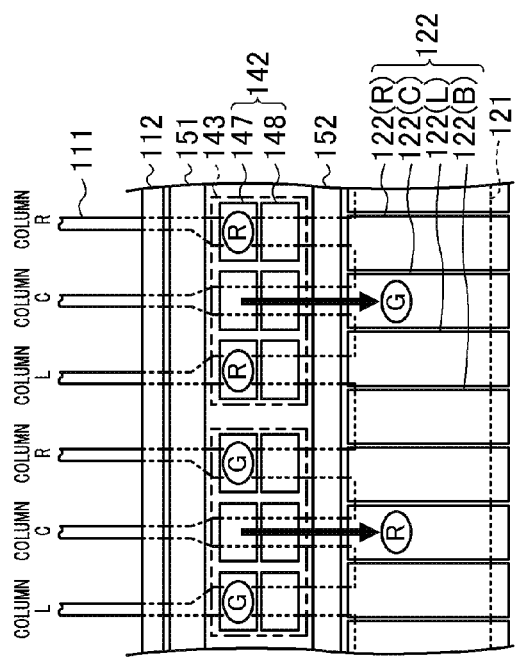
FIGS. 6A-6D are diagrams showing charge transfer in a movie mode of the solid-state image sensor of the first embodiment.
Figure 7:
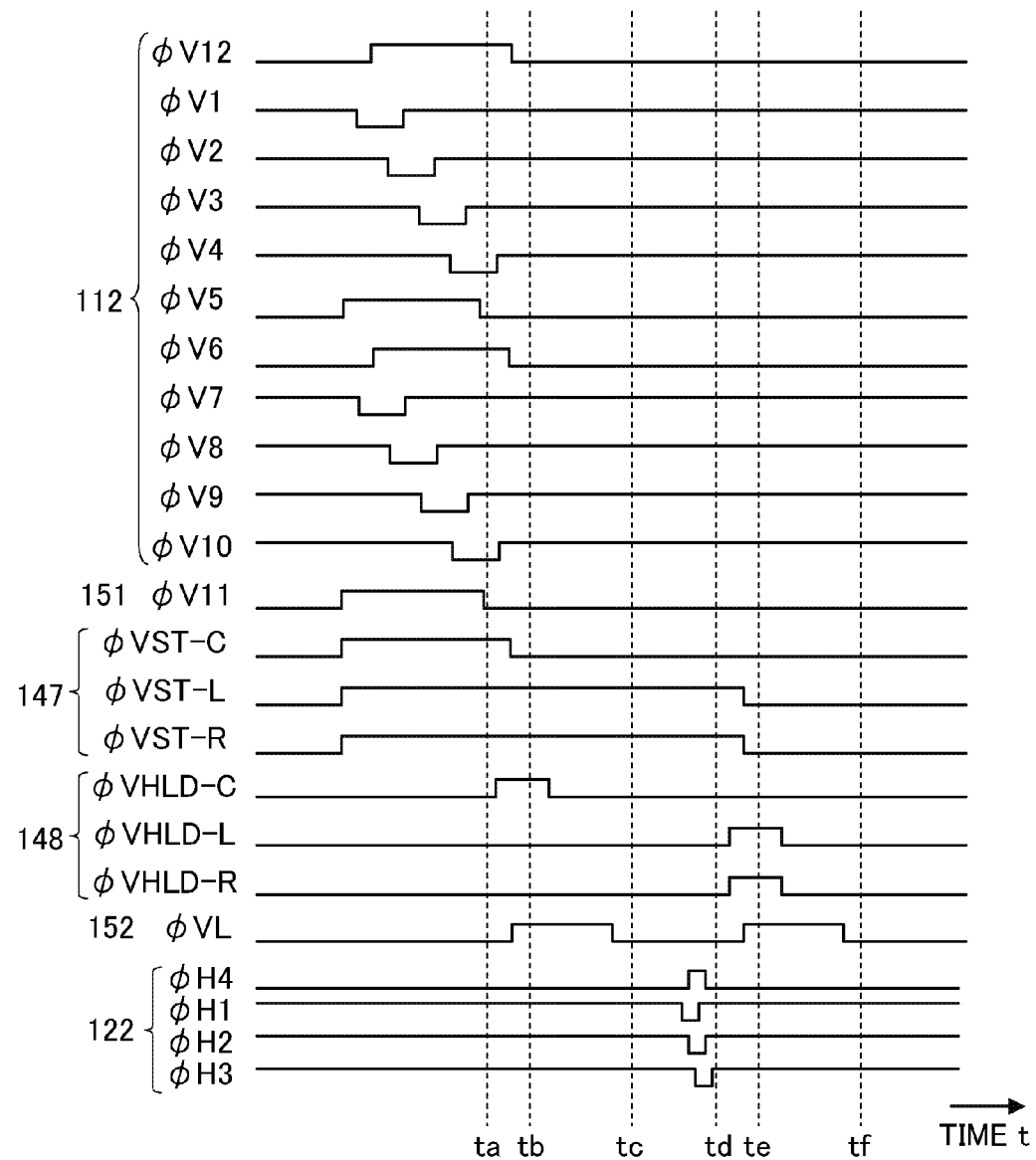
FIG. 7 is a timing chart showing drive timings in the movie mode of the solid-state image sensor of the first embodiment.

First, as shown in FIG. 6A, signal charges of each column are transferred to the signal charge accumulating electrodes 147 via the intermediate electrode 151. In this case, at time to in FIG. 7, the pulse φV11 that is applied to the intermediate electrode 151 is at low level, and φVST-L that is applied to the signal charge accumulating electrode 147 of column L, φVST-C that is applied to the signal charge accumulating electrode 147 of column C, and φVST-R that is applied to the signal charge accumulating electrode 147 of column R are at high level (e.g., 0 V), as in the operation in the normal mode. Moreover, φVHLD-L, φVHLD-C, and φVHLD-R, which are applied to the transfer inhibiting electrodes 148 of the respective columns, are at low level to form a potential barrier, thereby inhibiting transfer of signal charges to the subsequent stage.

Figure 6B:
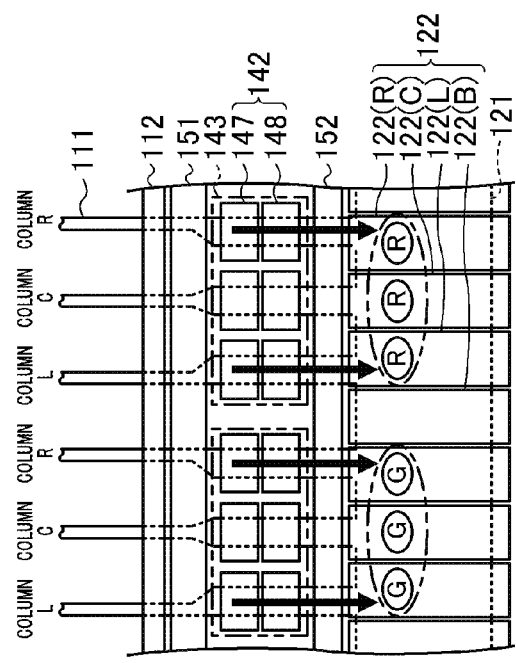
Figure 6C:
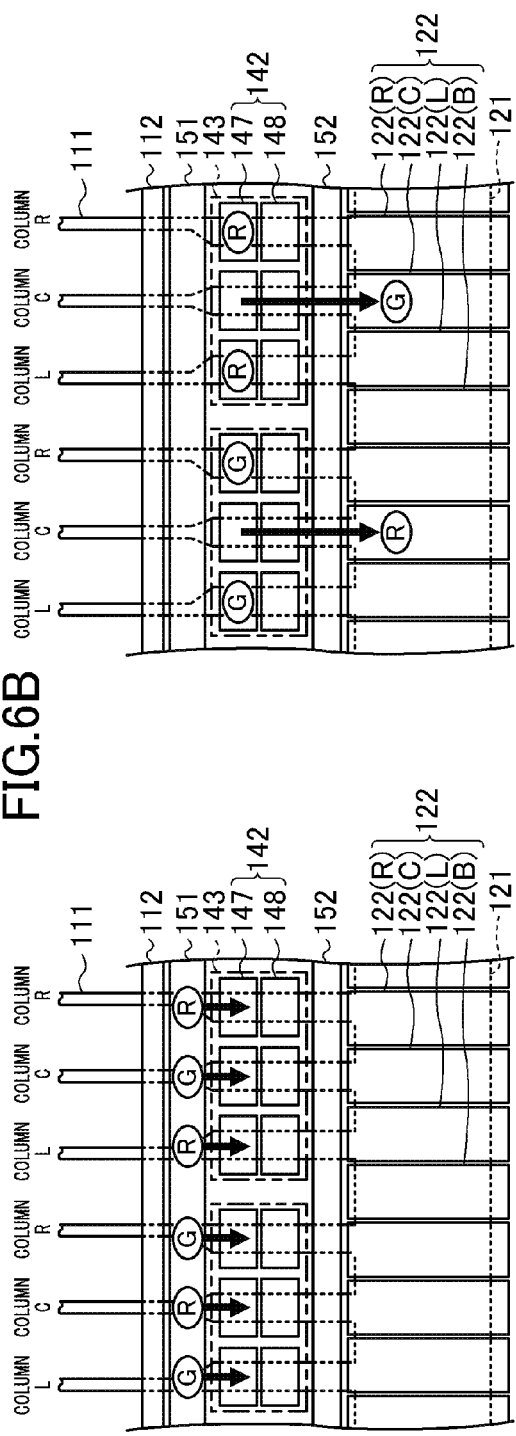

Then, as shown in FIG. 6B, signal charges of column C are transferred to the horizontal transfer section 102. In this case, in the period of tb-tc in FIG. 7, the transfer pulses φVHLD-L and φVHLD-R that are applied to the transfer inhibiting electrodes 148 of columns L and R, respectively, are kept at low level to hold signal charges of these columns in the signal charge accumulating electrodes 147. Moreover, φVHLD-C that is applied to the transfer inhibiting electrode 148 of column C and φVL that is applied to the last electrode 152 are transitioned to low level. φH1 that is applied to the horizontal transfer electrode 122(R), φH2 that is applied to the horizontal transfer electrode 122(C), and φH3 that is applied to the horizontal transfer electrode 122(L) are at high level. Thereafter, as shown in FIG. 6C, the signal charges are transferred leftward by three columns in the period of tc-td.

Figure 6D:
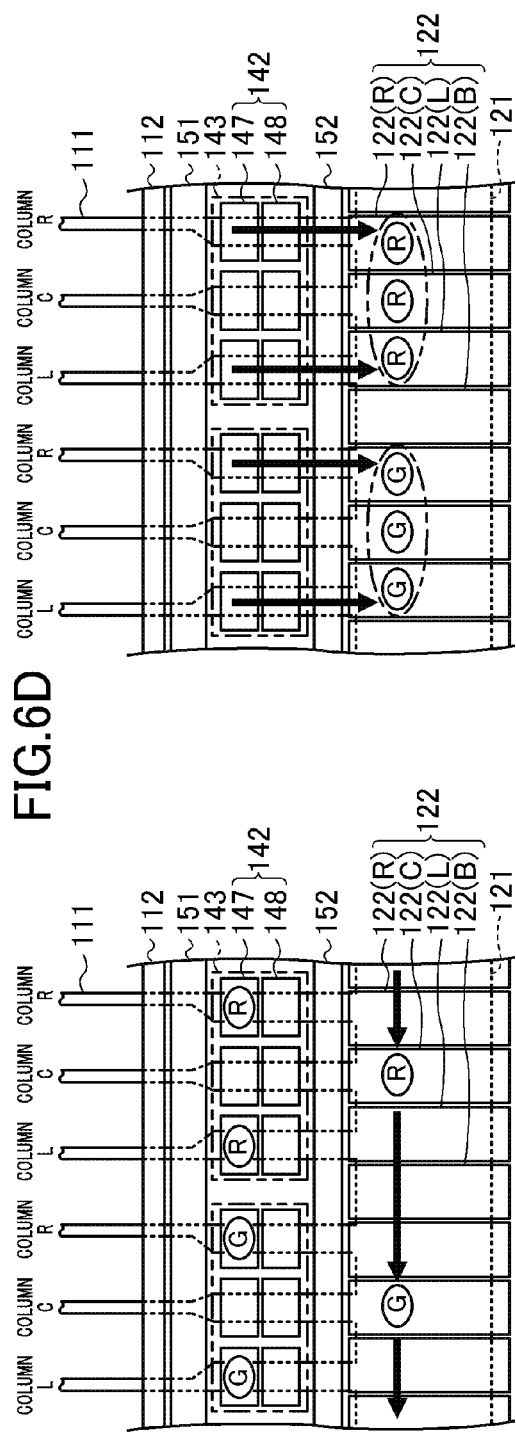

Then, the signal charges of three pixels are added as shown in FIG. 6D. In this case, φVHLD-L and φVHLD-R that are respectively applied to the transfer inhibiting electrodes 148 of columns L and R, and φVL that is applied to the vertical last electrode 13 are transitioned to low level in the period of te-tf in FIG. 7. Moreover, φH1 that is applied to the horizontal transfer electrode 122(R), φH2 that is applied to the horizontal transfer electrode 122(C), φH3 that is applied to the horizontal transfer electrode 122(L) are at high level, whereby the signal charges of columns L and R are transferred to the horizontal transfer section 102.

Three-pixel addition can be performed in the vertical transfer section 101 by providing a plurality of read electrodes in the vertical transfer section 101 and driving the read electrodes as appropriate. In this case, a nine-pixel addition operation can be implemented by combining this three-pixel addition with the horizontal three-pixel addition described above. Note that an example of first transferring the signal charges of column C and then adding the signal charges of columns L and R thereto in the horizontal transfer section 102 is described above as a horizontal signal addition operation. However, it is also possible to first transfer the signal charges of columns L and R, and then to add the signal charges of column C thereto.

However, first transferring the signal charges of one pixel to the horizontal transfer section 102 is more advantageous than first transferring the signal charges of two pixels to the horizontal transfer section 102. Specifically, in the case where the signal charges of one pixel are first transferred to the horizontal transfer section 102, a larger potential difference can be obtained between the vertical transfer channel 111 and the horizontal transfer channel 121 below the last electrode 152 when the signal charges are subsequently transferred from the transfer control section 104 to the horizontal transfer section 102 (when three pixels are added together). Thus, the transfer electric field from the vertical transfer section 101 to the horizontal transfer section 102 can be enhanced.

Figure 8:
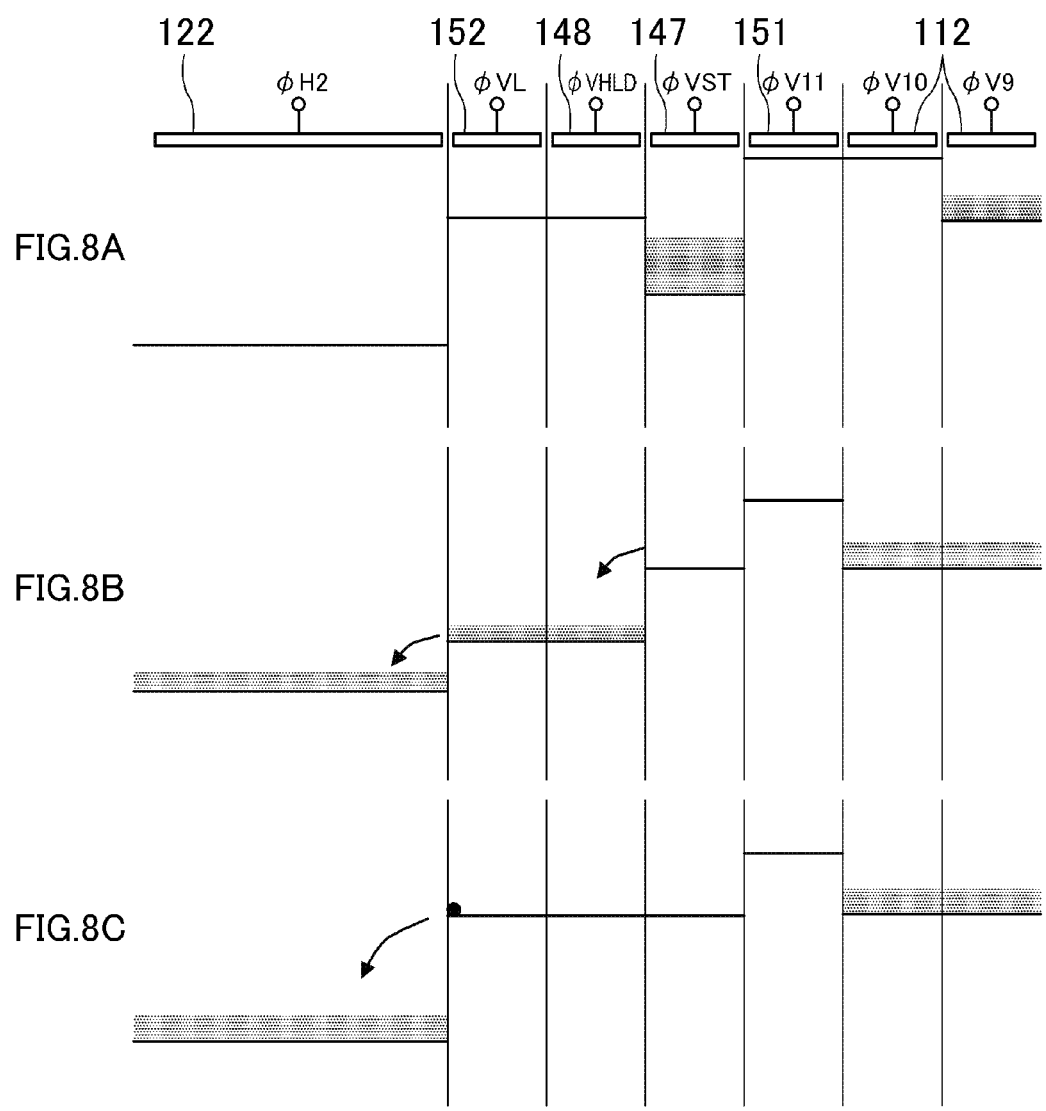
FIGS. 8A-8C are diagrams showing the states of potentials when transferring signal charges from a vertical transfer section to a horizontal transfer section in the solid-state image sensor of the first embodiment.

The reason why the solid-state image sensor of the present embodiment is capable of reducing the possibility of transfer degradation from the vertical transfer section 101 to the horizontal transfer section 102 will be described below. FIGS. 8A-8C show the potentials when transferring the signal charges from the vertical transfer section 101 to the horizontal transfer section 102. FIG. 8A corresponds to time to in FIG. 7, FIG. 8B corresponds to time tb in FIG. 7, and FIG. 8C correspond to time tc in FIG. 7.

First, as shown in FIG. 8A, φVST-C that is applied to the signal charge accumulating electrode 147 is at high level, φVHLD-C that is applied to the transfer inhibiting electrode 148 and φVL that is applied to the last electrode 152 are at low level, and signal charges are held in the signal charge accumulating electrodes 147.

Then, as shown in FIG. 8B, φVST-C is set to low level, and φVHLD-C, φVL, φH1, φH2, and φH3 are set to high level. Thus, the signal charges held in the signal charge accumulating electrode 147 are transferred to the horizontal transfer section 102.

Then, as shown in FIG. 8C, φVL is transitioned from high level to low level, whereby the signal charge transfer from the vertical transfer section 101 to the horizontal transfer section 102 is completed. Since the vertical transfer channels 111 are not bundled as in the conventional example, the potential depth of the last electrode 152 can be reduced. As described in detail later, since φH1 that is applied to the horizontal transfer electrode 122(R), φH2 that is applied to the horizontal transfer electrode 122(C), and φH3 that is applied to the horizontal transfer electrode 122(L) are set to high level at the same time, the potential depth of the horizontal transfer channel 121 can be increased. Thus, when transferring the signal charges from the vertical transfer section 101 to the horizontal transfer section 102, the potential difference between the vertical transfer section 101 and the horizontal transfer section 102 can be increased, whereby a strong transfer electric field can be ensured, and the possibility of transfer degradation can be reduced.

Figure 9:
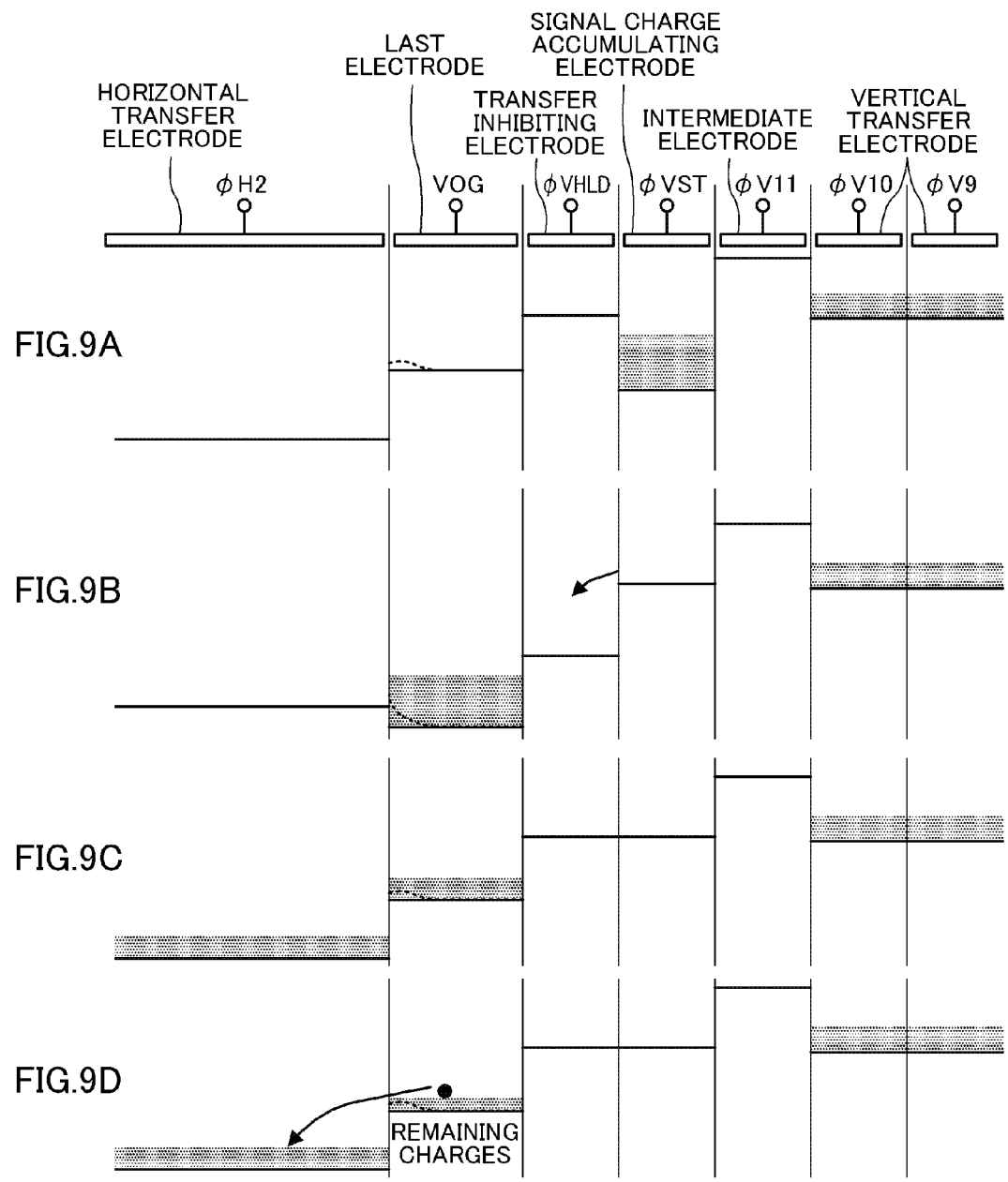
FIGS. 9A-9D are diagrams showing the states of potentials when transferring signal charges from a vertical transfer section to a horizontal transfer section in a conventional solid-state image sensor.

FIGS. 9A-9D show the potentials in the case where vertical transfer channels are bundled in a conventional transfer control section. As shown in FIG. 9A, φVST-C is set to high level, and φVHLD-C and φVOG that is applied to a last electrode are set to low level, whereby signal charges are held in a signal charge accumulating electrode.

Then, as shown in FIG. 9B, φVST-C is set to low level, and φVHLD-C, φVOG, φH1, φH2, and φH3 are set to high level, whereby the signal charges held in the signal charge accumulating electrode are transferred to the horizontal transfer section.

Then, as shown in FIG. 9C, φVOG is transitioned from high level to low level, whereby signal charge transfer from a vertical transfer section to the horizontal transfer section is completed. At this time, the potential below the last electrode is deep as the vertical transfer channels are bundled, and the potential difference between the vertical transfer section and the horizontal transfer section is small, whereby a sufficient transfer electric field cannot be ensured.

Moreover, as shown by a dotted line in FIG. 9C, in the case where the vertical transfer channels are bundled, and the vertical transfer section is narrowed down toward the horizontal transfer section, the potential of the vertical transfer channels on the side of the horizontal transfer section below the horizontal last electrode is shallow. This may cause a potential dip. If the potential dip occurs, some of the signal charges are left without being transferred, as shown in FIG. 9D.

Note that as in the solid-state image sensor of the present embodiment, in the case where the electrodes to which different transfer pulses are respectively applied are densely arranged, it is preferable to form each electrode by a single layer because forming each electrode by two layers makes interconnect layout difficult due to the overlap between the electrodes.

Figure 10:
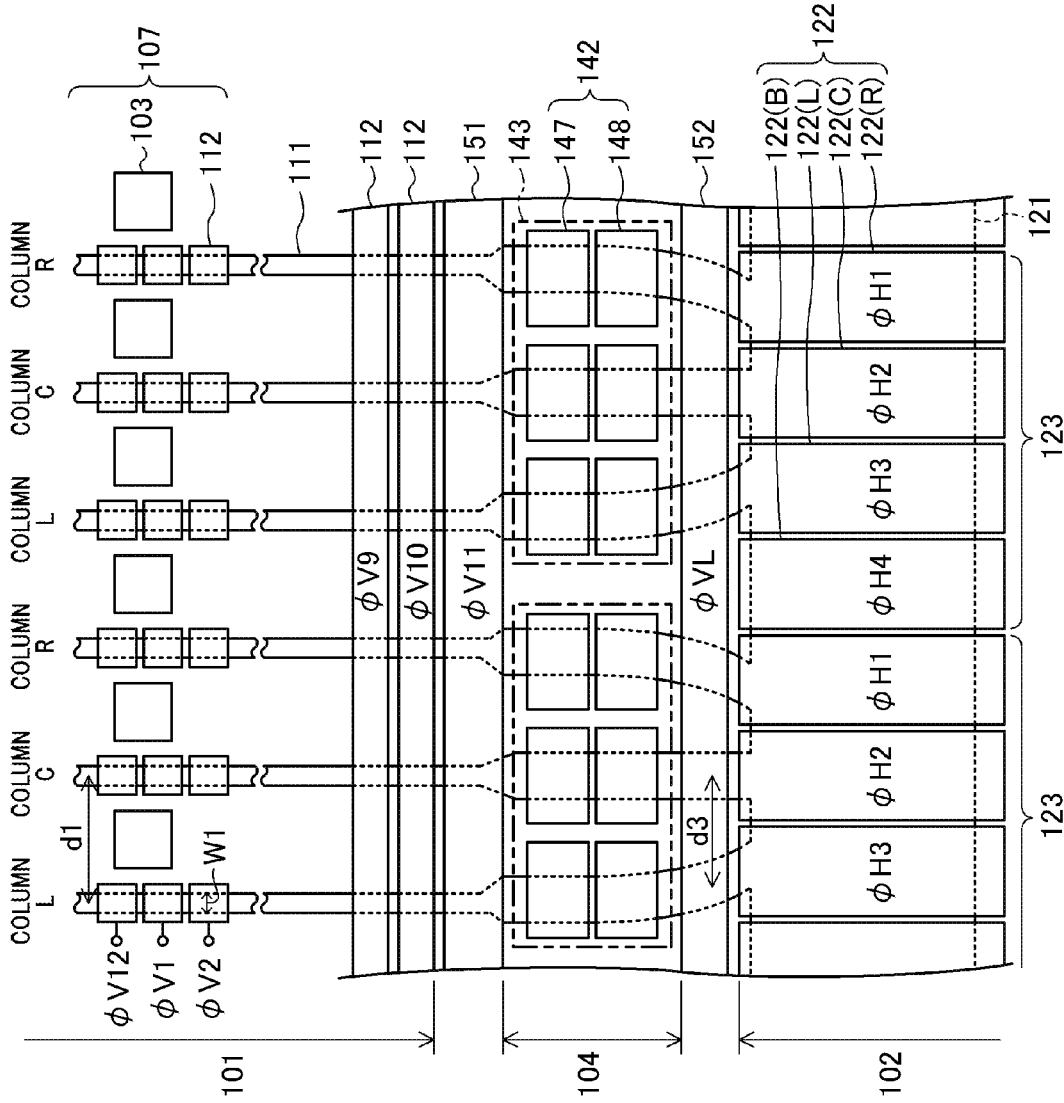
FIG. 10 is a plan view showing a configuration of a modification of the solid-state image sensor of the first embodiment.

In the solid-state image sensor shown in FIG. 1, the width of the vertical transfer channel 111 of column C is increased in a bilaterally symmetrical manner in a region where the width of the vertical transfer channel 111 is increased. However, the width of the vertical transfer channels 111 of columns R and L is increased only toward column C. Thus, an interval d2 between the centers of the vertical transfer channels 111 in the transfer control section 104 is shorter than an interval d1 between the centers of the vertical transfer channels 111 in the pixel repetition region 107. Note that as shown in FIG. 10, the width of the vertical transfer channels 111 of columns L, C, and R may be increased in a bilaterally symmetrical manner, and the vertical transfer channels 111 of columns L and R may be placed obliquely toward column C in the transfer control section 104. In this case, an interval d3 between the centers of the vertical transfer channels 111 located on the horizontal transfer section 102 side of the transfer inhibiting electrode 148 is shorter than the interval d1.

As described above, in the solid-state image sensor of the present embodiment, since the vertical transfer channels are not bundled in the transfer control section that selectively controls signal charge transfer from the vertical transfer section to the horizontal transfer section, transfer degradation can be suppressed. Moreover, since 3:1 horizontal interlace is performed, the number of horizontal transfer electrodes in the horizontal transfer section is reduced to about ⅓ of that in the case where the horizontal interlace is not performed in in-phase drive, whereby low power consumption can be implemented. Moreover, signal charges of pixels can be efficiently added in the horizontal transfer section, whereby a solid-state image sensor capable of achieving both efficient pixel addition and reduced power consumption can be implemented.

Second Embodiment

Figure 11:
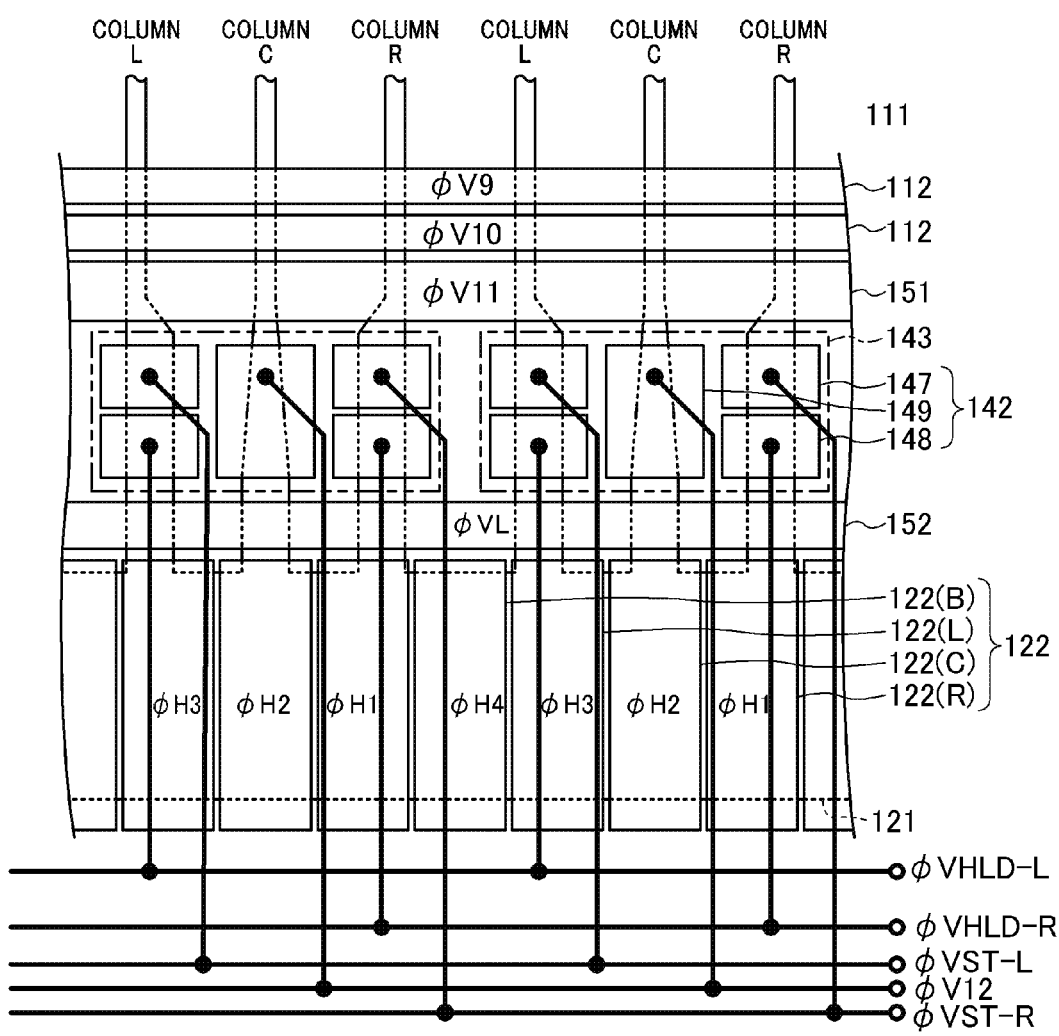
FIG. 11 is a plan view showing a configuration of a solid-state image sensor of a second embodiment.
Figure 12:
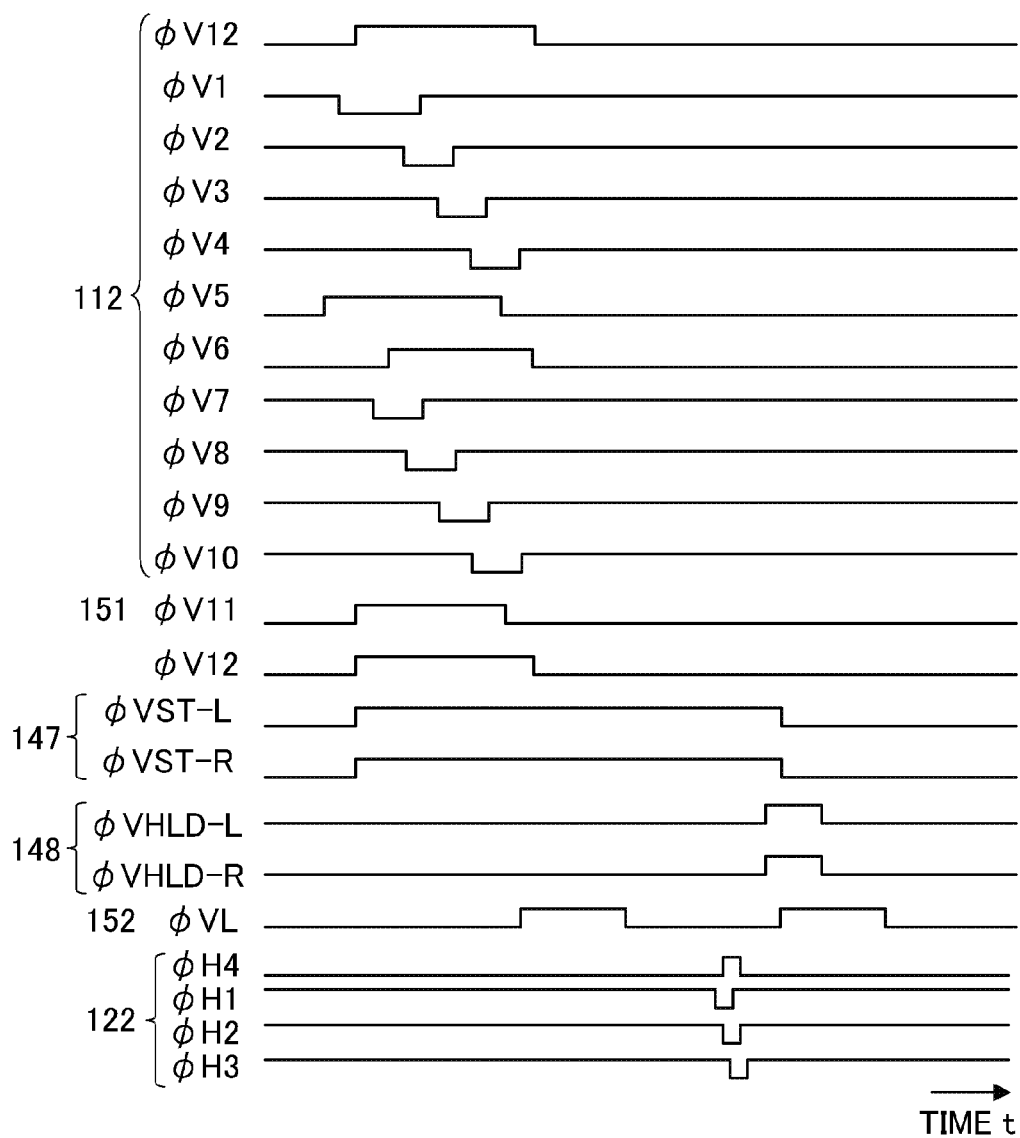
FIG. 12 is a timing chart showing drive timings in a moving image mode of the solid-state image sensor of the second embodiment.

FIG. 11 shows a configuration of a solid-state image sensor of a second embodiment. FIG. 12 shows drive timings in the movie mode of the solid-state image sensor of the present embodiment. In FIG. 11, the same components as those of FIG. 1 are denoted by the same reference characters, and description thereof will be omitted.

In the solid-state image sensor of the first embodiment, the signal charge accumulating electrode 147 and the transfer inhibiting electrode 148 are also provided in column C whose signal charges are first transferred from the transfer control section 104 to the horizontal transfer section 102 in the normal mode and the movie mode, as in the columns R and L. However, in column C whose signal charges are always transferred first, signal charges are not necessarily held in the transfer control section 104. Thus, the control section electrodes in column C may be a control section transfer electrode 149 to which the same transfer pulse is applied as that is applied to the vertical transfer electrodes 112 provided in the pixel repetition region 107.

Since signal charges need not be held in column C, the vertical transfer channel 111 of column C can be narrower than the vertical transfer channels 111 of columns L and R. Thus, the transfer electric field can be enhanced by increasing the width of the vertical transfer channel 111 of column C toward the horizontal transfer section 102, and using the narrow channel effect, as shown in FIG. 11. This eliminates the need to provide two control section electrodes 142, namely the signal charge accumulating electrode 147 and the transfer inhibiting electrode 148, in column C as in columns L and R, and a sufficient effect as a potential barrier can be produced by the single control section transfer electrode 149.

In the normal mode, in the solid-state image sensor of the present embodiment as well, the transfer pulse φVST-C that is applied to the signal charge accumulating electrode 147 of column C is the same timing pulse as the transfer pulse φV12 that is applied to the vertical transfer electrodes 112 in the pixel repetition region 107. Thus, the solid-state image sensor of the present embodiment operates without any problem even if the transfer pulse φV12 that is applied to the vertical transfer electrodes 112 in the pixel repetition region 107 is applied to the control section transfer electrode 149 provided in column C. In the movie mode as well, the solid-state image sensor of the present embodiment operates without any problem even if the transfer pulse φV12 is applied to the control section transfer electrode 149, as long as the solid-state image sensor is driven as shown in FIG. 12. φVST-C and φVHLD-C that are applied to the signal charge accumulating electrode 147 and the transfer inhibiting electrode 148 in the first embodiment are not required. Since the four pulses φVST-R, φVST-L, φVHLD-R, and φVHLD-L, and the pulse φV12 are the pulses to be applied to the transfer control section 104, the number of pins of a package can be reduced.

Third Embodiment

Figure 13:
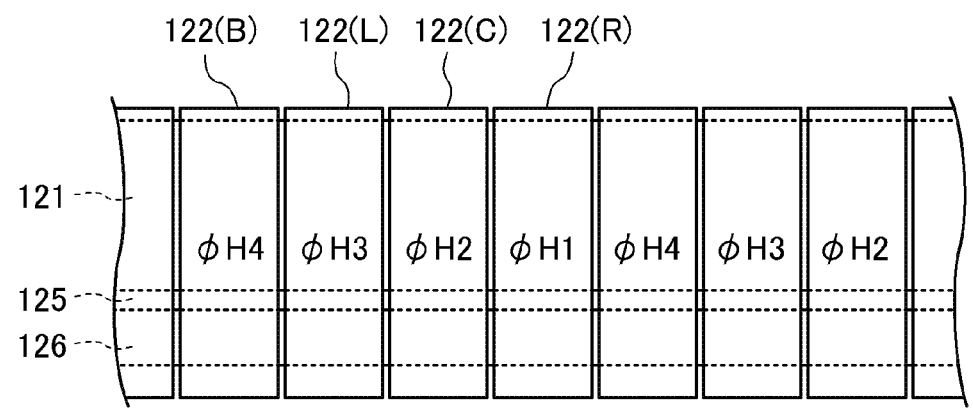
FIG. 13 is a plan view showing a configuration of a horizontal transfer section of a solid-state image sensor of a third embodiment.

FIG. 13 shows a configuration of a horizontal transfer section in a third embodiment. In FIG. 13, the same components as those of FIG. 1 are denoted by the same reference characters, and description thereof will be omitted. In a solid-state image sensor of the present embodiment, a barrier region 125 and a horizontal drain 126 are formed so as to adjoin the horizontal transfer channel 121.

Figure 14A:
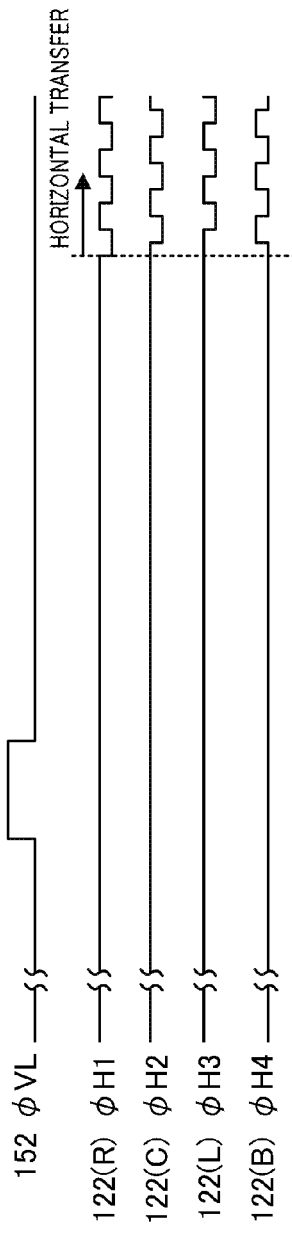
FIGS. 14A-14C are timing charts showing examples of drive pulses that are applied to horizontal transfer electrodes, where

In the first embodiment, as shown in FIG. 14A, signal charges from the last electrode 152 are received by the horizontal transfer electrodes 122(R), 122(C), and 122(L), and are accumulated therein until horizontal transfer is started. In the present embodiment, however, the number of horizontal transfer electrodes to which a high-level voltage is applied is changed after the signal charge transfer from the last electrode 152 to the horizontal transfer section 102 is completed.

Figure 14B:
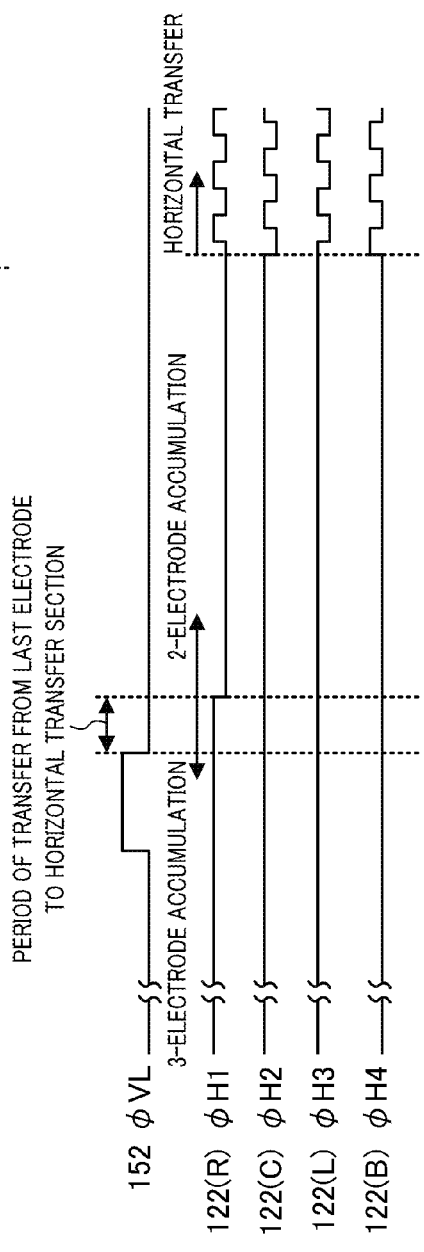
Figure 14C:
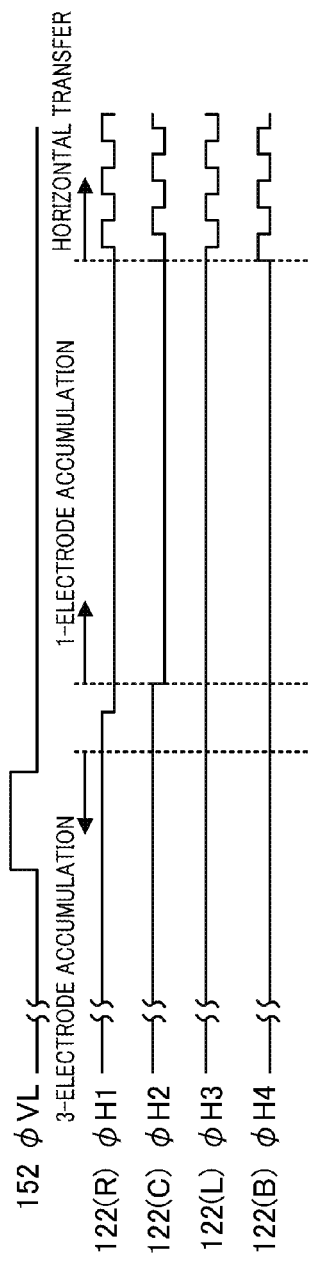

As shown in, e.g., FIG. 14B, after the transfer is completed, the horizontal transfer electrode 122(R) is at low level, and the horizontal transfer electrode 122(C) and the horizontal transfer electrode 122(L) is at high level. Thus, the state where the charges accumulated in three electrodes is transitioned to the state where the charges are accumulated in two electrodes. As shown in FIG. 14C, the horizontal transfer electrode 122(R) and the horizontal transfer electrode 122(C) may be at low level, and the horizontal transfer electrode 122(L) may be at high level. In this case, the charges are accumulated in one electrode.

In typical CCD solid-state image sensors, the barrier region 125 and the horizontal drain 126 are provided so as to adjoin the horizontal transfer channel 121, as shown in FIG. 13. This allows unwanted signal charges that have overflown the vertical transfer section 101 and the horizontal transfer section 102 to be discharged to the horizontal drain 126, thereby reducing entering of the signal charges into an optical black portion. Moreover, providing the barrier region 125 and the horizontal drain 126 also reduces the possibility that in the last stage of the horizontal transfer section 102, excessive signal charges may leak to a charge detection section (typically, floating diffusion is used), the signal charges may leak to a feedthrough after the signal charges are reset, and in extreme cases, an image after correlated double sampling (CDS) may become dark.

In the solid-state image sensor of the first embodiment, since the three horizontal transfer electrodes are at high level, a large number of charges are accumulated, and the potential depth of the horizontal transfer section 102 after the signal charges are transferred to the horizontal transfer section 102 is greater than in the case of the two-electrode accumulation or the one-electrode accumulation. Thus, in some cases, unwanted charges are less likely to be discharged to the horizontal drain 126. However, if the potential depth of the barrier region 125 is increased excessively so as to allow the unwanted charges to be discharged to the horizontal drain 126, the saturation signal amount is reduced in the case where charge transfer is performed in the two-electrode accumulation in four-phase drive. Thus, as shown in FIG. 14B, high level is applied to two electrodes before the horizontal transfer is started as in the case of the transfer.

A state where the horizontal accumulating electrodes are transitioned in a horizontal blanking period will be described in detail below.

Figure 16A:
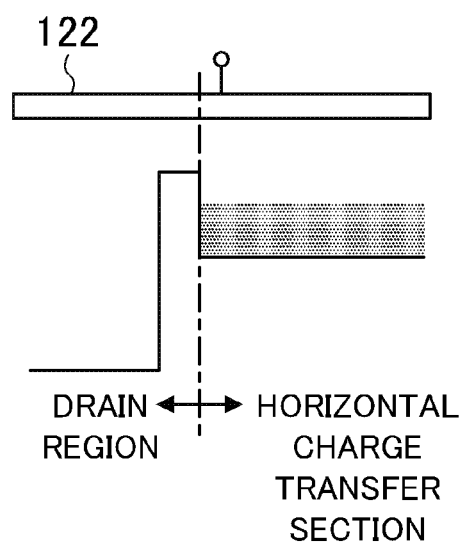
FIGS. 16A-16B are diagrams showing the states of charges near a horizontal transfer drain.
Figure 16B:
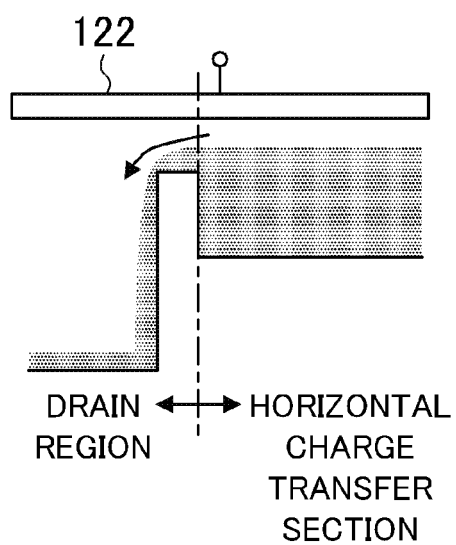

FIG. 15A shows a state where signal charges are accumulated in the three electrodes in the horizontal transfer section 102, where dotted lines indicate the potential of the barrier region 125 provided between the horizontal transfer section 102 and the horizontal drain 126. FIG. 16A shows the potential near the horizontal drain 126 in the case of the three-electrode accumulation. As shown in FIG. 15B, when the state is transitioned from the three-electrode accumulation to the two-electrode accumulation, excess signal charges are discharged to the horizontal drain 126 beyond the barrier region 125, as shown in FIG. 16B. After the excess charges are discharged as shown in FIG. 15C, the signal charges are horizontally transferred by four-phase drive and are output while performing two-electrode accumulation as shown in FIG. 15D, according to the drive timings of FIG. 14B. If high level is applied to one electrode as shown in FIG. 14C, the saturation signal amount during the transfer does not become smaller than that in the case where the signal charges are accumulated in two electrodes in the horizontal blanking period. Thus, the signal charges are discharged to the horizontal drain 126 during the transfer, whereby the possibility of horizontal shading can be reduced.

Figure 18:
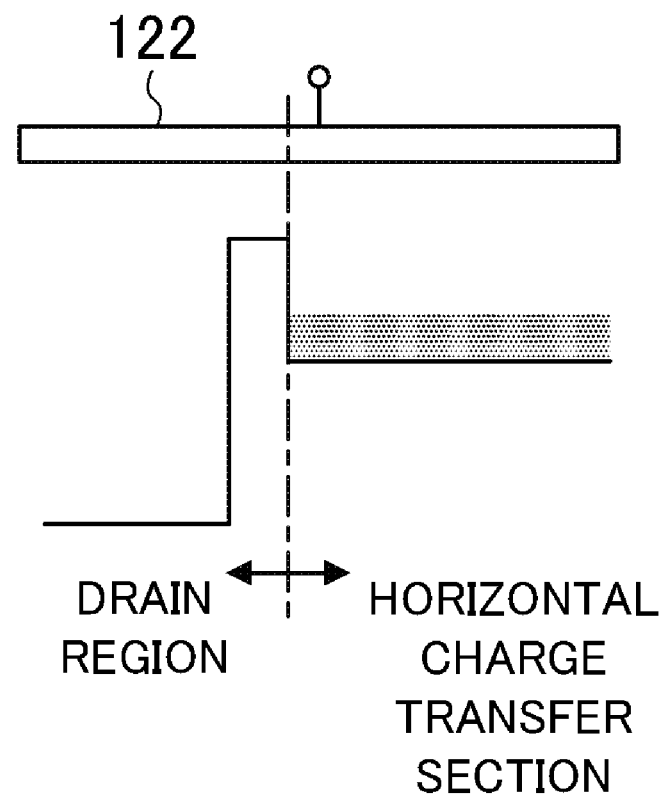
FIG. 18 is a diagram showing a state of charges near the horizontal transfer drain.

FIGS. 17A-17E sequentially show transition from the state where the signal charges are accumulated in three electrodes in the horizontal transfer section 102 in the horizontal blanking period to the state of two-electrode accumulation and to the state of one-electrode accumulation. After transition to the one-electrode accumulation, and excess charges are discharged, the signal charges are transferred and output by four-phase drive while being accumulated in two electrodes as shown in FIG. 17F. FIG. 18 shows the potential near the horizontal drain 126, corresponding to FIG. 17F. The saturation signal amount during the one-electrode accumulation in the horizontal blanking period is smaller than that during transfer in the two-electrode accumulation, whereby the horizontal shading can further be reduced.

Note that the driving method of the present embodiment is a driving method of the horizontal transfer section, and thus is applicable regardless of whether the horizontal transfer channels are bundled or not. The same effects can be produced by either one of the configurations.

As described above, according to the present embodiment, a solid-state image sensor can be implemented which can reduce horizontal shading and leakage of signal charges to the feedthrough, and which does not reduce the saturation signal amount of the horizontal transfer section.

Fourth Embodiment

Figure 19A:
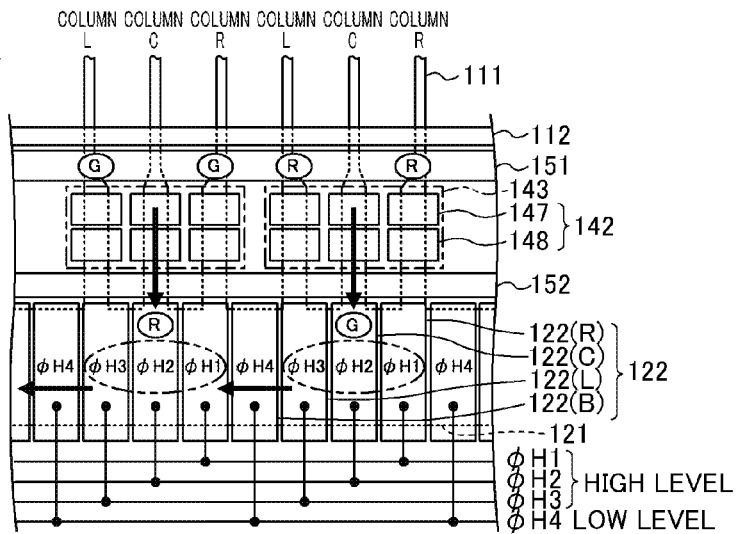
FIGS. 19A-19C are diagrams showing charge transfer in a normal mode of a solid-state image sensor of a fourth embodiment.
Figure 19B:
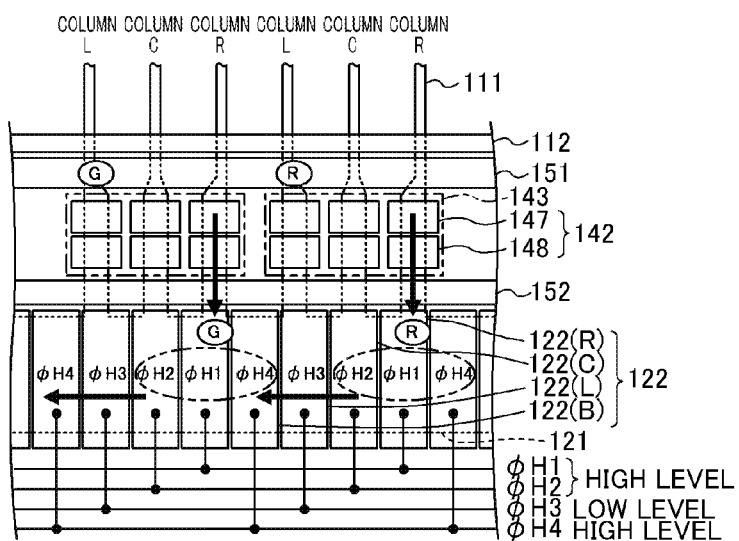
Figure 19C:
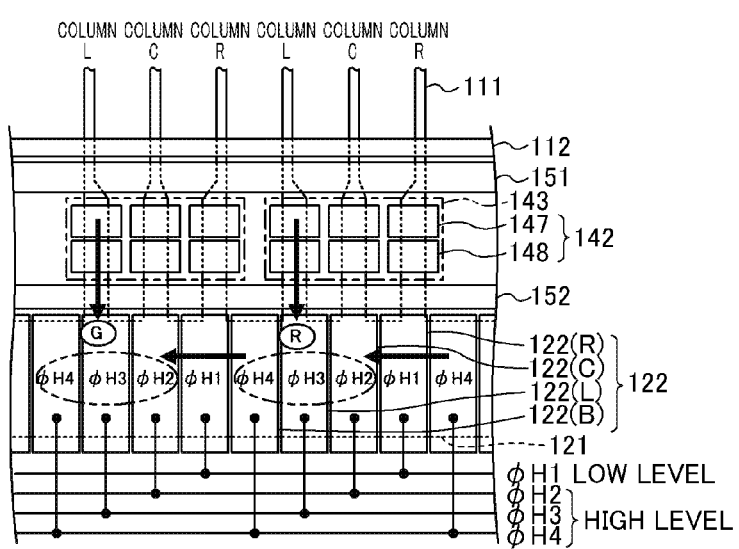

FIGS. 19A-19C show charge transfer in the normal mode of a solid-state image sensor of the fourth embodiment. In FIGS. 19A-19C, the same components as those of FIG. 2 are denoted by the same reference characters, and description thereof will be omitted. The solid-state image sensor of the first embodiment applies a high-level voltage to three horizontal transfer electrodes when transferring signal charges from the vertical transfer section to the horizontal transfer section in the horizontal blanking period in the normal mode in which horizontal interlace is performed. However, the solid-state image sensor of the present embodiment switches a horizontal electrode to which a high-level voltage is applied, according to the column whose charges are transferred.

If the width of the vertical transfer channels 111 is increased in the solid-state image sensor of the first embodiment, the three vertical transfer channels 111 may not fit in a region from the horizontal transfer electrode 122(L) to the horizontal transfer electrode 122(R). In this case, it is more difficult to transfer the signal charges of columns L and R to the horizontal transfer section 102 than the signal charges of column C, thereby causing a variation in the number of signal charges among the columns. Thus, the solid-state image sensor of the present embodiment applies a high-level voltage to the horizontal transfer electrodes 122(R), 122(C), and 122(L), and applies a low-level voltage to the horizontal transfer electrode 122(B), as shown in FIG. 19A, when transferring the signal charges of column C to the horizontal transfer section 102. When transferring the signal charges of column R to the horizontal transfer section 102, the solid-state image sensor of the present embodiment applies a high-level voltage to the horizontal transfer electrodes 122(R), 122(C), and 122(B), and applies a low-level voltage to the horizontal transfer electrode 122(L), as shown in FIG. 19B. When transferring the signal charges of column L to the horizontal transfer section 102, the solid-state image sensor of the present embodiment applies a high-level voltage to the horizontal transfer electrodes 122(C), 122(L), and 122(B), and applies a low-level voltage to the horizontal transfer electrode 122(R), as shown in FIG. 19C. This allows the vertical transfer channels 111 to have substantially the same positional relation with the three horizontal transfer electrodes 122 that receive the signal, respectively. Thus, even if the width of the vertical transfer channels 111 is increased, a variation in transfer of the signal charges among the columns is reduced, thereby reducing the possibility of generation of fixed pattern noise (FPN).

Figure 20A:
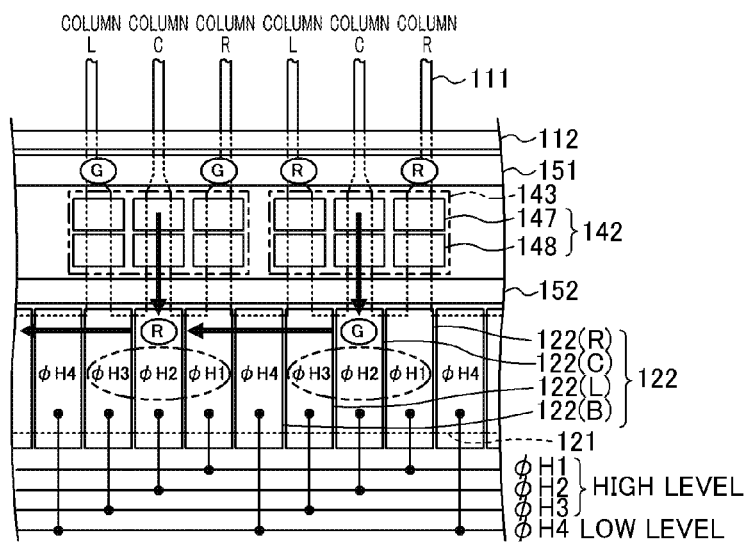
FIGS. 20A-20C are diagrams showing charge transfer in a pixel addition mode of the solid-state image sensor of the fourth embodiment.
Figure 20B:
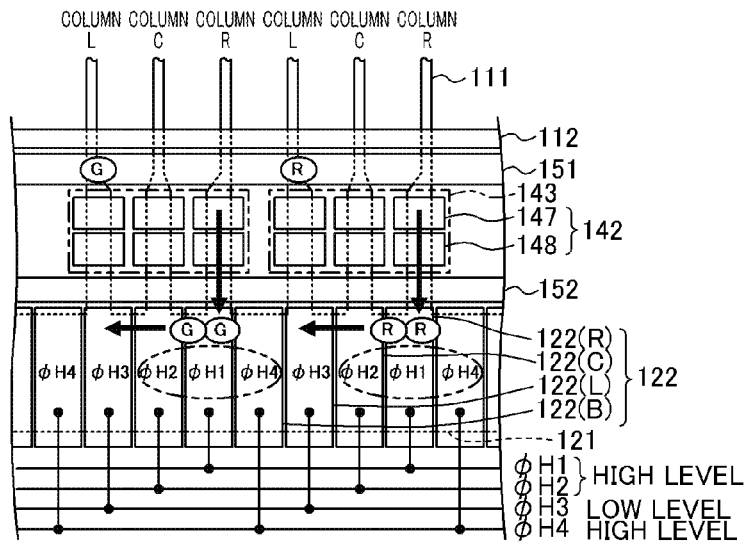
Figure 20C:
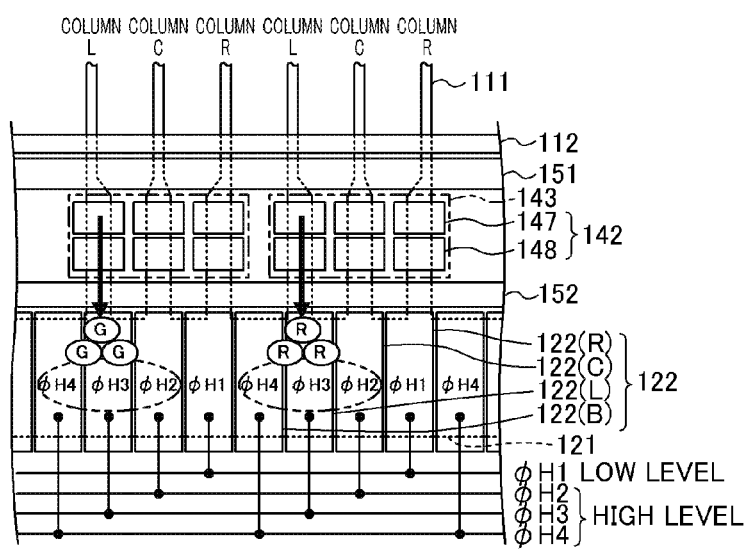

In a mode in which addition of three pixels of the same color adjoining each other in the horizontal direction is performed, the solid-state image sensor of the first embodiment implements the three-pixel addition by first transferring the signal charges of column C to the horizontal transfer portion 102, and then transferring the signal charges horizontally, and subsequently transferring the signal charges of columns L and R to the horizontal transfer section 102. However, the solid-state image sensor of the present embodiment does not simultaneously transfer the signal charges of columns L and R to the horizontal transfer section 102 in the pixel addition mode, as shown in FIGS. 20A-20C. First, as shown in FIG. 20A, the horizontal transfer electrodes 122(R), 122(C), and 122(L) are set to high level, and the signal charges of column C are transferred to the horizontal transfer section 102. Then, as shown in FIG. 20B, the horizontal transfer electrodes 122 (R), 122(C), and 122(B) are set to high level, and the signal charges of column R are transferred to the horizontal transfer section 102. Thereafter, as shown in FIG. 20C, the horizontal transfer electrodes 122(C), 122(L), and 122(B) are set to high level, and the signal charges of column L are transferred to the horizontal transfer section 102. The solid-state image sensor of the present embodiment implements the three-pixel addition in this manner.

As described above, the solid-state image sensor of the present embodiment is advantageous in that defective transfer such as FPN and a variation in transfer among the columns can be reduced when transferring signal charges from the vertical transfer section to the horizontal transfer section.

Fifth Embodiment

Figure 21:
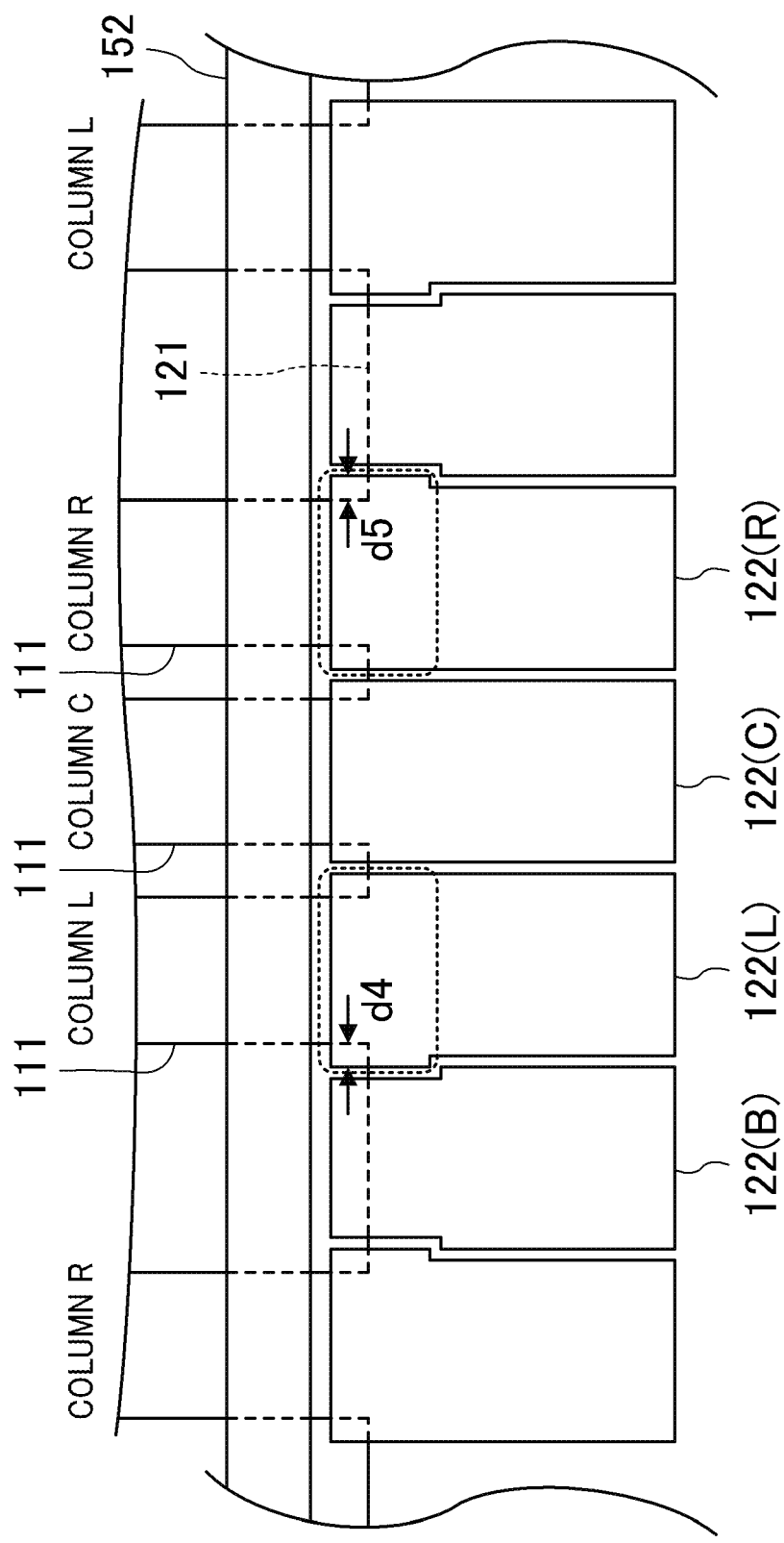
FIG. 21 is a plan view showing a configuration of a horizontal transfer section of a solid-state image sensor of a fifth embodiment.

FIG. 21 shows a configuration near a last electrode 152 of a solid-state image sensor according to a fifth embodiment. In FIG. 21, the same components as those of FIG. 1 are denoted by the same reference characters, and description thereof will be omitted. In the solid-state image sensor of the present embodiment, the horizontal lengths of the horizontal transfer electrodes 122(R), 122(C), and 122(L) that are set to high level in a horizontal blanking period are locally varied. In a region near the boundary between the vertical transfer section 101 and the horizontal transfer section 102, the respective horizontal lengths of the horizontal transfer electrodes 122 (R) and 122(L) are made greater than that of the horizontal transfer electrode 122(C), and the horizontal length of the horizontal transfer electrode 122(B) is made shorter than that of the horizontal transfer electrode 122(C). Thus, a horizontal distance d4 between the respective ends of the vertical transfer channel 111 of column L and the horizontal transfer electrode 122(L), and a horizontal distance d5 between the respective ends of the vertical transfer channel 111 of column R and the end of the horizontal transfer electrode 122(R) can be increased, whereby the width of the vertical transfer channels 111 can be increased. This can improve efficiency of signal charge transfer from the vertical transfer channel 111 of column L and the vertical transfer channel 111 of column R to the horizontal transfer section 102, whereby a variation in signal charge transfer among the columns can be reduced.

Sixth Embodiment

Figure 22:
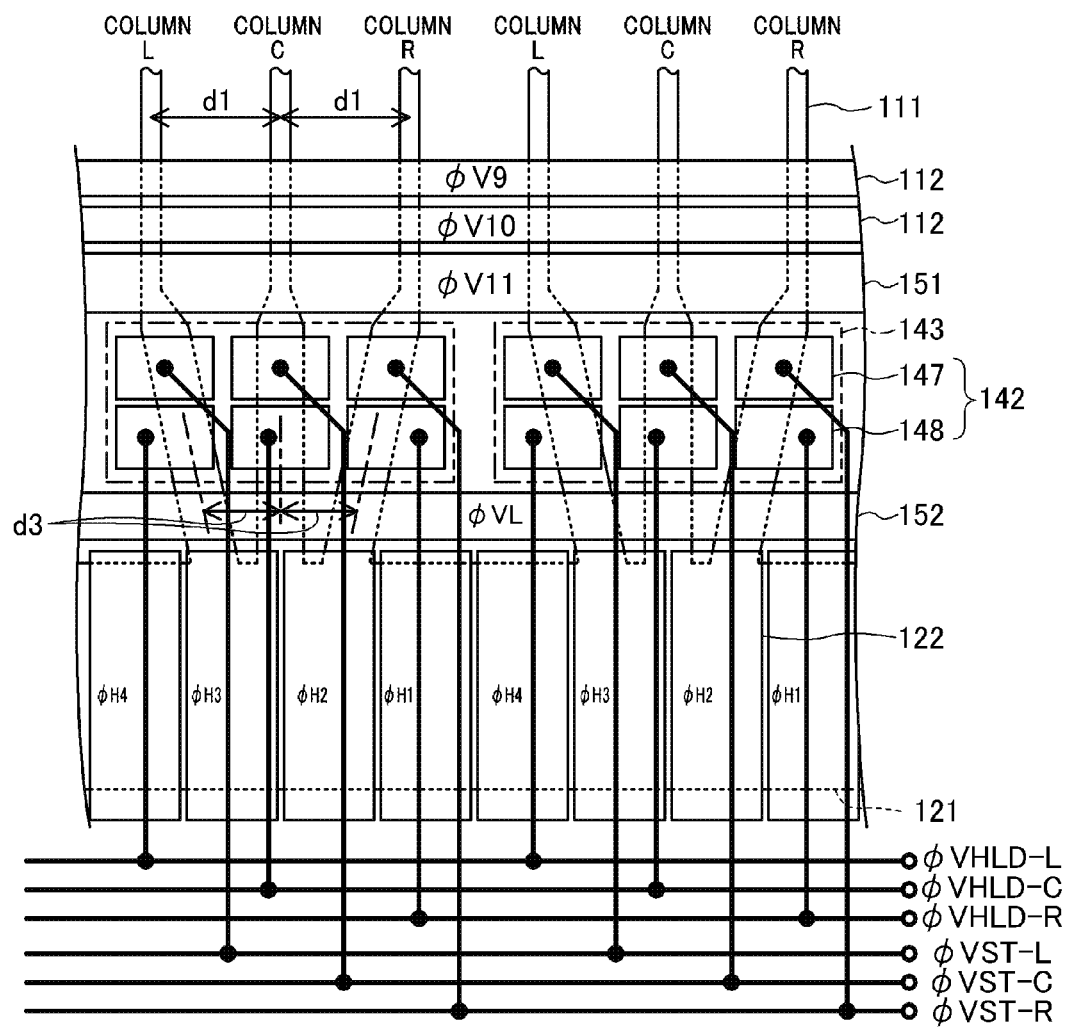
FIG. 22 is a plan view showing a configuration of a solid-state image sensor of a sixth embodiment.

FIG. 22 shows a configuration of a solid-state image sensor of a sixth embodiment. In FIG. 22, the same components as those of FIG. 1 are denoted by the same reference characters, and description thereof will be omitted. In the solid-state image sensor of the present embodiment, the vertical transfer channels 111 of the three columns are arranged so as to correspond to two of the four horizontal transfer electrodes 122. Thus, an interval d3 between the centers of the vertical transfer channels 111 on the side of the horizontal transfer portion 102 with respect to the transfer inhibiting electrodes 148 is shorter than an interval d1 between the centers of the vertical transfer channels 111 in the pixel repetition region 107.

The solid-state image sensor of the present embodiment is capable of receiving signal charges by setting two horizontal transfer electrodes 122 to high level in a horizontal blanking period. Thus, both reduction in saturation signal amount of the horizontal transfer section 102 and horizontal shading can be suppressed. Note that as in the fifth embodiment, the length of the two horizontal transfer electrodes that are set to high level in the horizontal blanking period may be locally increased near the last electrode 152.

As described above, in the solid-state image sensor of the present embodiment, the vertical transfer channels 111 of columns R, C, and L correspond to two of the four horizontal transfer electrodes that form one transfer packet. This can suppress both horizontal shading and reduction in saturation signal amount of the horizontal transfer section even in a high-brightness optical imaging operation.

Seventh Embodiment

Figure 23:
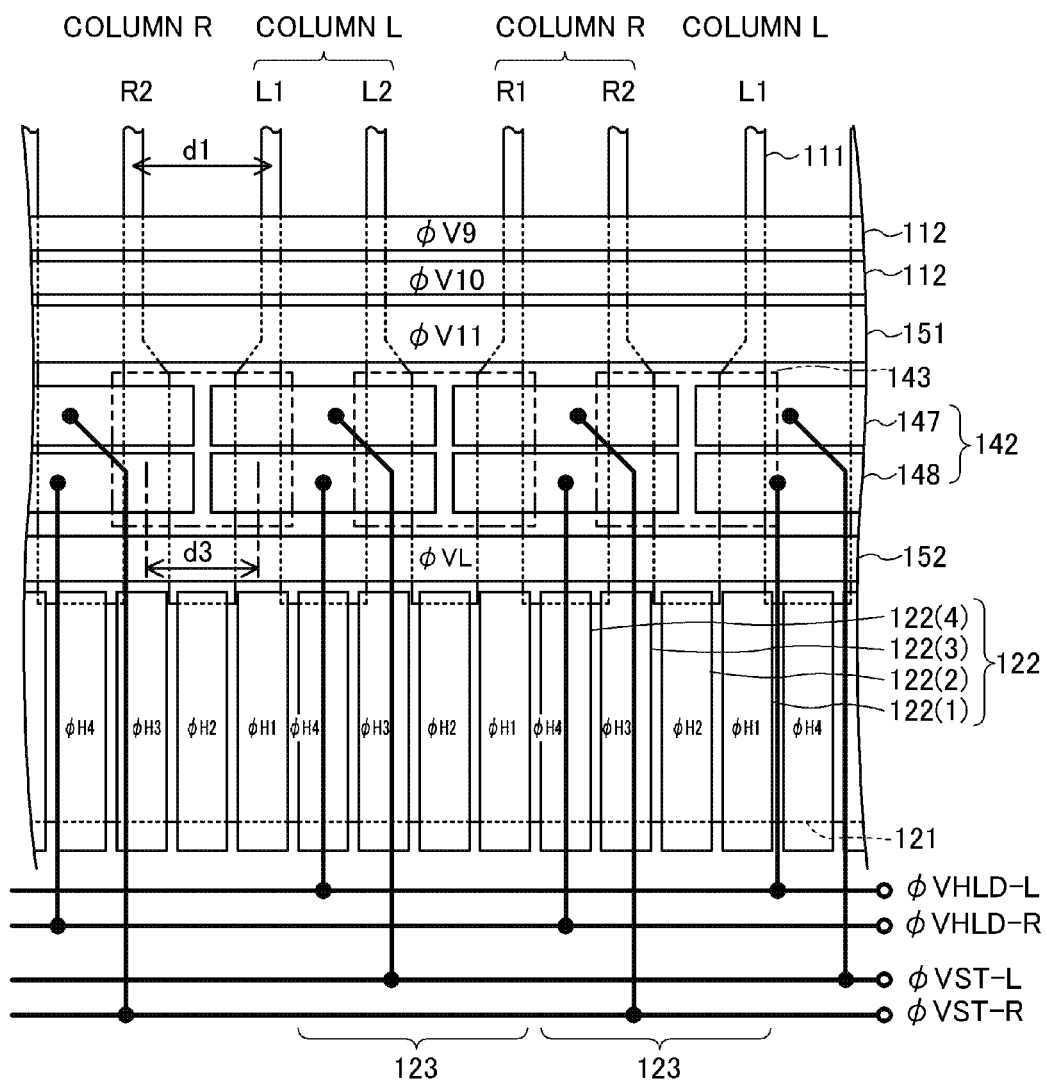
FIG. 23 is a plan view showing a configuration of a solid-state image sensor of a seventh embodiment.
Figure 25:
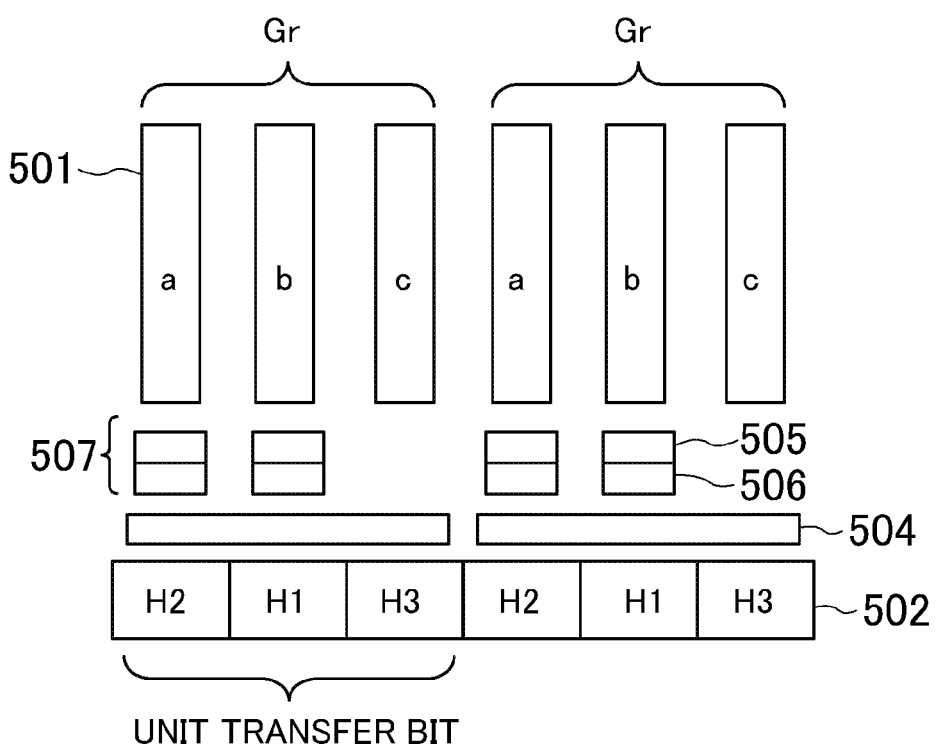
FIG. 25 is a plan view showing a configuration of a solid-state image sensor of a conventional example.

FIG. 23 shows a configuration of a solid-state image sensor of a seventh embodiment. In FIG. 23, the same components as those of FIG. 1 are denoted by the same reference characters, and description thereof will be omitted. The solid-state image sensor of the present embodiment includes the vertical transfer channels 111 of two columns R and L, column R includes columns R1 and R2, and column L includes columns L1 and L2. Each unit control section 143 corresponds to either columns R1 and L2 or columns R2 and L1. A signal charge accumulating electrode 147 and a transfer inhibiting electrode 148 corresponding to adjoining ones of columns R1 and R2 are formed as an integral signal charge accumulating electrode 147 and an integral transfer inhibiting electrode 148, respectively. Moreover, a signal charge accumulating electrode 147 and a transfer inhibiting electrode 148 corresponding to adjoining ones of columns L1 and L2 are formed as an integral signal charge accumulating electrode 147 and an integral transfer inhibiting electrode 148, respectively. That is, the signal charge accumulating electrode 147 and the transfer inhibiting electrode 148 included in adjoining two of the unit control sections 143 are formed as an integral signal charge accumulating electrode 147 and an integral transfer inhibiting electrode 148, respectively.

The vertical transfer channels 111 included in one unit control section 143 correspond to four horizontal transfer electrodes 122 included in one transfer packet 123. In the following description, horizontal transfer electrodes 122(1), 122(2), 122(3), and 122(4) are the four horizontal electrodes included in one transfer packet 123. The vertical transfer channel 111 of column R1 or L1 corresponds to the horizontal transfer electrode 122(1), and the vertical transfer channel 111 of column R2 or L2 corresponds to the horizontal transfer electrode 122(3).

In the solid-state image sensor of the present embodiment, the number of packets formed in the horizontal transfer section 102 is half the number of columns of the vertical transfer channels 111. Thus, in the normal mode, signal charges of one line are divided into two for interlace output. Addition of adjoining two pixels of the same color can be performed as horizontal pixel addition, and no interlace is required in this case. Note that FIG. 23 shows an example in which each unit control section 143 of the transfer control section 104 is formed by two signal charge accumulating electrodes 147 and two transfer inhibiting electrodes 148, to which φVST-R, φVST-L, φVHLD-R, and φVHLD-L are applied, respectively. However, horizontal four-pixel addition can be performed by increasing the respective numbers of signal charge accumulating electrodes 147 and transfer inhibiting electrodes 148 to which different voltages can be independently applied, respectively.

FIGS. 24A and 24B show operation of the horizontal two-pixel addition. As shown in FIG. 24A, the horizontal transfer electrodes 122(1), 122(2), and 122(3) are first set to high level, and the horizontal transfer electrode 122(4) is set to low level, whereby signal charges of column R are transferred to the horizontal transfer section 102. At this time, a high-level voltage is applied to the signal charge accumulating electrode 147 of column L, and a low-level voltage is applied to the transfer inhibiting electrode 148 of column L and the last electrode 152, whereby signal charges of column L are held below the signal charge accumulating electrode 147.

Then, the signal charges of the column R transferred to the horizontal transfer section 102 are horizontally transferred by two columns (one unit). Subsequently, as shown in FIG. 24B, the voltage that is applied to the transfer inhibiting electrode 148 of column L and the last electrode 152 is transitioned, and the horizontal transfer electrodes 122(1), 122(2), and 122(3) are set to high level, and the horizontal transfer electrode 122(4) is set to low level. Thus, the signal charges of column L are transferred to the horizontal transfer section 102, whereby horizontal two-pixel addition is performed.

Pixel addition can also be performed within the vertical transfer section 101 by providing a plurality of read electrodes in the vertical transfer section 101, and driving them as appropriate. Four-pixel addition can be implemented by combining the pixel addition within the vertical transfer section 101 with the horizontal two-pixel addition. Nine-pixel addition can be implemented by combining the horizontal three-pixel addition with the vertical three-pixel addition. In the nine-pixel addition, there is no displacement of the center of gravity after the addition, and a high-quality moving image with less moire can be implemented. In the nine-pixel addition, however, since the number of pixels after the addition is significantly reduced, the resolution is not high enough in the solid-state image sensors having a small number of pixels. On the other hand, in the four-pixel addition combining the horizontal two-pixel addition and the vertical two-pixel addition, sensitivity is higher than in the normal mode in which no pixel addition is performed, whereby a still picture having a larger number of pixels after the addition than that in the nine-pixel addition can be implemented. Thus, this solid-state image sensor is useful when, e.g., performing continuous shooting by a digital still camera.

Note that in FIG. 23, the vertical transfer channels 111 of two columns included in the unit control section 143 are widened asymmetrically in the horizontal direction. Thus, the interval between the centers of the vertical transfer channels 111 of the two columns included in the unit control section 143 is shorter in the transfer control section (the interval d3) than in the pixel repetition region (the interval d1). However, the vertical transfer channels 111 of columns L and R may be increased symmetrically in the horizontal direction as long as the vertical transfer channels 111 of the two columns fit in an overall region of the horizontal transfer electrodes 122(1), 122(2), and 122(3). In this case, the interval between the centers of the vertical transfer channels 111 of the two columns included in the unit control section 143 is the same between the pixel repetition region and the transfer control section.

As described above, since the solid-state image sensor of the present embodiment is capable of performing horizontal two-pixel addition and reducing power consumption by including the vertical transfer channels 111 of two columns in the unit control section 143.

The solid-state image sensor of the present invention has low power consumption, and is capable of efficiently perform addition of signal charges of horizontally adjoining pixels of the same color, and thus is capable of implementing a high-speed movie mode. Thus, the solid-state image sensor of the present invention is especially useful as a solid-state image sensor for digital still cameras.

What is claimed is:

1. A solid-state image sensor, comprising:
a plurality of photoelectric conversion elements arranged in a matrix pattern in a pixel repetition region;
a vertical transfer section configured to read charges from the photoelectric conversion elements to transfer the read charges in a column direction;
a horizontal transfer section configured to receive the charges from the vertical transfer section to transfer the received charges in a row direction; and
a transfer control section configured to control the charge transfer from the vertical transfer section to the horizontal transfer section, wherein
the vertical transfer section has a plurality of vertical transfer channels extending in the column direction, and a plurality of vertical transfer electrodes formed over the vertical transfer channels,
the horizontal transfer section has a horizontal transfer channel extending in the row direction, and a plurality of horizontal transfer electrodes formed over the horizontal transfer channel, and is formed by a plurality of transfer packets,
the transfer packet includes adjoining two or more of the plurality of horizontal transfer electrodes, and correspond to adjoining two or more of the plurality of vertical transfer channels,
the transfer control section has a plurality of unit control sections corresponding to the transfer packets,
the unit control section has the vertical transfer channel and a plurality of control section electrodes formed over the vertical transfer channel,
the control section electrodes include a signal charge accumulating electrode and a transfer inhibiting electrode, which are sequentially formed from a side of the vertical transfer section,
the vertical transfer channels are independently connected to the horizontal transfer channel, and
when stopping the charge transfer from the vertical transfer section to the horizontal transfer section, a high-level voltage is applied to the signal charge accumulating electrode, and a low-level voltage is applied to the transfer inhibiting electrode.

2. The solid-stage image sensor of claim 1, wherein
the signal charge accumulating electrode and the transfer inhibiting electrode are independently formed in each of the unit control sections.

3. The solid-stage image sensor of claim 1, wherein
the signal charge accumulating electrode and the transfer inhibiting electrode, which are included in different adjoining ones of the unit control sections, are formed as an integral signal charge accumulating electrode and an integral transfer inhibiting electrode, respectively.

4. The solid-state image sensor of claim 1, wherein
the control section electrodes include a control section transfer electrode,
the control section transfer electrode is formed over the vertical transfer channel that is different from the vertical transfer channel over which the signal charge accumulating electrode and the transfer inhibiting electrode are formed, and
the control section transfer electrode is driven by a same transfer pulse as that of the vertical transfer electrode provided in the pixel repetition region.

5. The solid-state image sensor of claim 4, wherein
the vertical transfer channel located below the control section transfer electrode is wider on a side of the horizontal transfer section than on a side of the vertical transfer section.

6. The solid-state image sensor of claim 1, further comprising:
an intermediate electrode formed over the vertical transfer channels between the transfer control section and the vertical transfer section, wherein
a potential at a position corresponding to the intermediate electrode in the vertical transfer channel when a low-level voltage is applied to the intermediate electrode is equal to a potential at a position corresponding to the vertical transfer electrode in the vertical transfer channel when the low-level voltage is applied to the vertical transfer electrode.

7. The solid-state image sensor of claim 1, further comprising:
an intermediate electrode formed over the vertical transfer channels between the transfer control section and the vertical transfer section, wherein
when the signal charges accumulated below the vertical transfer electrode adjoining the intermediate electrode are transferred to the transfer control section, the control section electrode adjoining the intermediate electrode rises to high level simultaneously with or earlier than the intermediate electrode.

8. The solid-state image sensor of claim 1, wherein
the vertical transfer channels are wider in the transfer control section than in the pixel repetition region, and
an interval between centers of adjoining ones of the vertical transfer channels included in one of the unit control sections is shorter in the transfer control section than in the pixel repetition region.

9. The solid-state image sensor of claim 1, wherein
the transfer packet includes four of the horizontal transfer electrodes, and corresponds to three of the vertical transfer channels, and
the three vertical transfer channels are connected to the horizontal transfer channel at a position where adjoining three of the horizontal transfer electrodes are placed.

10. The solid-state image sensor of claim 1, wherein
the transfer packet includes four of the horizontal transfer electrodes, and corresponds to three of the vertical transfer channels, and
the three vertical transfer channels are connected to the horizontal transfer channel at a position where adjoining three of the horizontal transfer electrodes are placed.

11. The solid-state image sensor of claim 1, wherein
the transfer packet includes four of the horizontal transfer electrodes, and corresponds to three of the vertical transfer channels, and
in a horizontal blanking period, a high-level voltage is applied to two or more of the four horizontal transfer electrodes, and the horizontal transfer section receives the signal charges from the three vertical transfer channels via the transfer control section.

12. The solid-state image sensor of claim 11, wherein
the high-level voltage is applied is three of the four horizontal transfer electrodes.

13. The solid-state image sensor of claim 1, wherein
the transfer packet includes at least one of the horizontal transfer electrodes that is wider on a side of the transfer control section than on a side opposite from the transfer control section, and at least one of the horizontal transfer electrodes that is narrower on the side of the transfer control section than on the side opposite from the transfer control section.

14. The solid-stage image sensor of claim 1, further comprising:
a horizontal drain region extending in the row direction and adjoining the horizontal transfer channels with a barrier region interposed between the horizontal drain region itself and the horizontal transfer channels.

15. The solid-state image sensor of claim 14, wherein
of the plurality of horizontal transfer electrodes, the number of horizontal transfer electrodes to which a high-level voltage is applied when the signal charges are transferred from the vertical transfer section is different from the number of horizontal transfer electrodes to which the high-level voltage is applied after the transfer of the signal charges is completed.

16. The solid-state image sensor of claim 15, wherein
the transfer packet includes four of the horizontal transfer electrodes, and corresponds to three of the vertical transfer channels, and
the solid-state image sensor performs an operation of applying the high-level voltage to three of the four horizontal transfer electrodes to transfer the signal charges from the three vertical transfer channels to the horizontal transfer section, an operation of applying a low-level voltage to one or two of the four horizontal transfer electrodes to accumulate the transferred signal charges below two or one of the four horizontal transfer electrodes, and an operation of applying the high-level voltage to two of the four horizontal transfer electrodes to transfer the accumulated signal charges in a horizontal direction.

17. The solid-state image sensor of claim 1, wherein
the unit control section has three of the vertical transfer channels, and
the solid-stage image sensor performs a first operation of transferring the signal charges from one of the three vertical transfer channels to a corresponding one of the transfer packets, a second operation of transferring in a horizontal direction the transferred signal charges to the transfer packet corresponding to an adjoining one of the unit control sections, and a third operation of transferring the signal charges from the other two of the three vertical transfer channels to the corresponding one of the transfer packets, thereby mixing the signal charges of the three vertical transfer channels in the horizontal transfer section.

18. The solid-state image sensor of claim 1, wherein
in a mode in which the signal charges of one line are divided for output,
the horizontal transfer electrode to which a high-level voltage is applied in a horizontal blanking period is different in every division field.

19. The solid-state image sensor of claim 18, wherein
the transfer packet includes four of the horizontal transfer electrodes and three of the vertical transfer channels, and
in the mode in which the signal charges of one line are divided for output,
the high-level voltage is applied to three of the four horizontal transfer electrodes, and
the horizontal transfer electrode that receives the signal charges from the three vertical transfer electrode is different in every division field.

20. A camera, comprising the solid-state image sensor of claim 1.

* * * * *